US012795997B2

(12) United States Patent
Chien et al.

(10) Patent No.: US 12,795,997 B2
(45) Date of Patent: Nov. 10, 2026

(54) METHODS OF FORMING CONTACT STRUCTURE IN SEMICONDUCTOR DEVICES

(71) Applicant: Taiwan Semiconductor Manufacturing Company Ltd., Hsinchu (TW)

(72) Inventors: Fan Hsuan Chien, Tainan City (TW); Kai-Shiung Hsu, Hsinchu City (TW); Shih-Chi Lin, Hsinchu City (TW); Cheng-Han Tsai, Tainan City (TW); Pei Yen Cheng, Tainan City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 413 days.

(21) Appl. No.: 18/221,160

(22) Filed: Jul. 12, 2023

(65) Prior Publication Data

US 2025/0022925 A1 Jan. 16, 2025

(51) Int. Cl.

| | |
|---|---|
| ***H10D 30/67*** | (2025.01) |
| ***H10D 30/01*** | (2025.01) |
| ***H10D 30/43*** | (2025.01) |
| ***H10D 62/10*** | (2025.01) |
| ***H10D 64/66*** | (2025.01) |
| ***H10D 84/01*** | (2026.01) |
| ***H10D 84/03*** | (2025.01) |
| ***H10D 84/85*** | (2025.01) |

(52) U.S. Cl.

CPC ....... *H10D 30/6729* (2025.01); *H10D 30/014* (2025.01); *H10D 30/43* (2025.01); *H10D 30/6735* (2025.01); *H10D 30/6757* (2025.01); *H10D 62/121* (2025.01); *H10D 64/668* (2025.01); *H10D 84/017* (2025.01); *H10D 84/0186* (2025.01); *H10D 84/038* (2025.01); *H10D 84/85* (2025.01)

(58) Field of Classification Search

CPC ............. H10D 30/6729; H10D 30/014; H10D 84/0186; H10D 84/85; H10D 30/6757; H10D 62/121; H10D 30/6735; H10D 84/017; H10D 30/43; H10D 84/038; H10D 64/668

USPC .......................................................... 257/288

See application file for complete search history.

(56) References Cited

U.S. PATENT DOCUMENTS

| | | | |
|---|---|---|---|
| 9,093,530 | B2 | 7/2015 | Huang et al. |
| 9,105,490 | B2 | 8/2015 | Wang et al. |

(Continued)

FOREIGN PATENT DOCUMENTS

| | | | | |
|---|---|---|---|---|
| CN | 114496918 A | * | 5/2022 | ......... H10D 84/0158 |

*Primary Examiner* — Norman D Richards
*Assistant Examiner* — Colin Russell McCutcheon
(74) *Attorney, Agent, or Firm* — Sterne, Kessler, Goldstein Fox P.L.L.C.

(57) ABSTRACT

A semiconductor device and a method of fabricating the semiconductor device are disclosed. The method includes forming a fin base on a substrate, epitaxially growing a S/D region on the fin base, forming a contact opening on the S/D region, forming a semiconductor nitride layer on a sidewall of the contact opening, performing a densification process on the semiconductor nitride layer to form a densified semiconductor nitride layer, forming a silicide layer on an exposed surface of the S/D region in the contact opening, forming a contact plug in the contact opening, and forming a via structure in the contact plug.

20 Claims, 30 Drawing Sheets

(56) References Cited

U.S. PATENT DOCUMENTS

| | | | |
|---|---|---|---|
| 9,171,929 | B2 | 10/2015 | Lee et al. |
| 9,214,555 | B2 | 12/2015 | Oxland et al. |
| 9,236,267 | B2 | 1/2016 | De et al. |
| 9,236,300 | B2 | 1/2016 | Liaw |
| 9,406,804 | B2 | 8/2016 | Huang et al. |
| 9,443,769 | B2 | 9/2016 | Wang et al. |
| 9,520,482 | B1 | 12/2016 | Chang et al. |
| 9,548,303 | B2 | 1/2017 | Lee et al. |
| 9,548,366 | B1 | 1/2017 | Ho et al. |
| 9,564,489 | B2 | 2/2017 | Yeo et al. |
| 9,576,814 | B2 | 2/2017 | Wu et al. |
| 9,601,342 | B2 | 3/2017 | Lee et al. |
| 9,608,116 | B2 | 3/2017 | Ching et al. |
| 9,831,183 | B2 | 11/2017 | Lin et al. |
| 9,859,386 | B2 | 1/2018 | Ho et al. |
| 2003/0228710 | A1* | 12/2003 | Drewes ................. C23C 16/303 438/785 |
| 2016/0307797 | A1* | 10/2016 | Farmer ............... H10W 20/048 |
| 2019/0140076 | A1* | 5/2019 | Hsieh ..................... H10D 30/62 |
| 2020/0161171 | A1* | 5/2020 | Colombeau ....... H01J 37/32816 |
| 2021/0090948 | A1* | 3/2021 | Chen ................... H10W 20/057 |
| 2021/0384345 | A1* | 12/2021 | Chen .................... H10D 30/668 |
| 2022/0059405 | A1 | 2/2022 | Chou et al. |
| 2022/0165856 | A1* | 5/2022 | Yu ...................... H10D 30/6729 |
| 2022/0302278 | A1 | 9/2022 | Cheng |
| 2022/0367623 | A1 | 11/2022 | Lee et al. |
| 2023/0013102 | A1 | 1/2023 | Wang et al. |
| 2023/0335399 | A1* | 10/2023 | Yong ................... H10P 14/6339 |

* cited by examiner

METHODS OF FORMING CONTACT STRUCTURE IN SEMICONDUCTOR DEVICES

BACKGROUND

With advances in semiconductor technology, there has been increasing demand for higher storage capacity, faster processing systems, higher performance, and lower costs. To meet these demands, the semiconductor industry continues to scale down the dimensions of semiconductor devices, such as metal oxide semiconductor field effect transistors (MOSFETs), fin field effect transistors (finFETs), and gate-all-around (GAA) FETs. Such scaling down has increased the challenges of manufacturing highly reliable semiconductor devices.

BRIEF DESCRIPTION OF THE DRAWINGS

Aspects of this disclosure are best understood from the following detailed description when read with the accompanying figures.

FIGS. 3A-15A and 3B-15B illustrate cross-sectional views of a semiconductor device with contact structures at various stages of its fabrication process, in accordance with some embodiments.

Illustrative embodiments will now be described with reference to the accompanying drawings. In the drawings, like reference numerals generally indicate identical, functionally similar, and/or structurally similar elements.

DETAILED DESCRIPTION

Figure 1A:
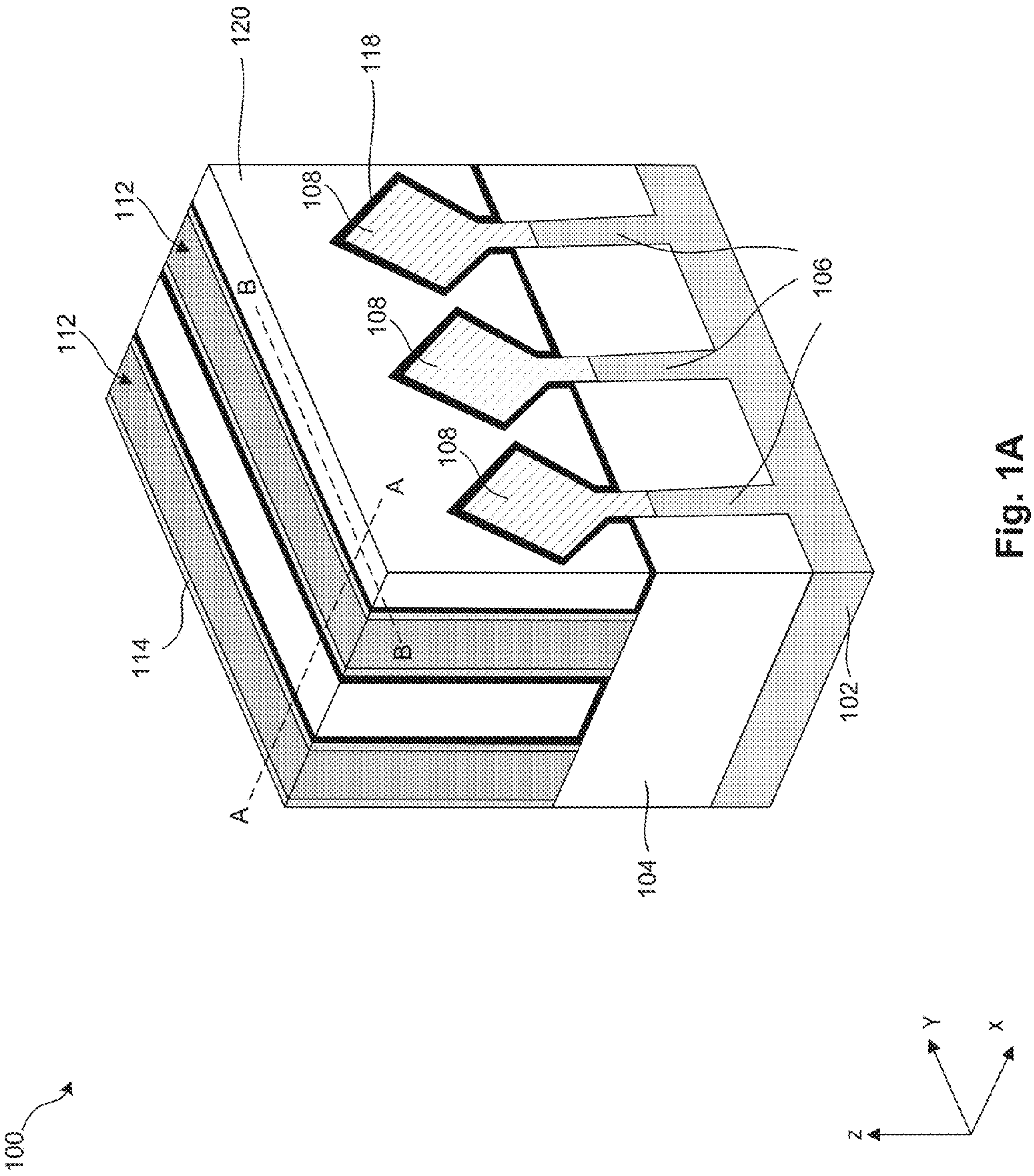
FIG. 1A illustrates an isometric view of a semiconductor device with contact structures, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the process for forming a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the various embodiments and/or configurations discussed.

Spatially relative terms, such as "beneath," "below," "lower," "above," "upper," and the like may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

In some embodiments, the terms "about" and "substantially" can indicate a value of a given quantity that varies within 5% of the value (e.g., ±1%, 2%, ±3%, 4%, ±5% of the value). These values are merely examples and are not intended to be limiting. The terms "about" and "substantially" can refer to a percentage of the values as interpreted by those skilled in relevant art(s) in light of the teachings herein.

The GAA transistor structures may be patterned by any suitable method. For example, the structures may be patterned using one or more photolithography processes, including double-patterning or multi-patterning processes. Double-patterning or multi-patterning processes can combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA transistor structure.

The reliability and performance of semiconductor devices (e.g., MOSFETs, finFETs, or GAA FETs) have been negatively impacted by the scaling down of semiconductor devices. The scaling down has resulted in smaller electrical isolation regions between contact structures on source/drain (S/D) regions and between via structures on the contact structures. The dielectric layers in such smaller electrical isolation regions may not adequately prevent conductive material leakage between adjacent via structures. As a result, current leakage through the conductive path formed between adjacent via structures can degrade the performance and reliability of the semiconductor device.

To address the abovementioned challenges, the present disclosure provides example contact structures with barrier layers to prevent or minimize conductive material leakage between adjacent via structures in FETs (e.g., finFETs and GAA FETs). In addition, the present disclosure provides example methods of forming the barrier layers to have higher material density, higher etch resistance, and/or higher resistance to halogen and/or oxygen diffusion. The barrier layers can prevent or minimize current leakage between the adjacent via structures. In some embodiments, a FET can include contact structures disposed on S/D regions and via structures disposed on the contact structures. First portions (also referred to as "via-anchors" or "via-bases") of the via structures can be disposed in the contact structures and second portions (also referred to as "via-tops") of the via structures can extend above the top surfaces of the contact structures. In some embodiments, the via-bases can be wider than the via-tops, which can result in adjacent via-bases being closer to each other than adjacent via-tops. In some embodiments, to prevent conductive material leakage between adjacent via-bases that are spaced apart from each other by a distance less than about 30 nm, the FET contact structures can include barrier layers disposed between the adjacent via-bases. Each of the barrier layers can surround the conductive plugs of the contact structure and the via structure.

In some embodiments, the barrier layer can include a stack of nitride layers. In some embodiments, the stack of nitride layers can include a semiconductor nitride layer, a metal layer, and a metal nitride layer. In some embodiments, a post-deposition plasma treatment, a post-deposition ultraviolet (UV) radiation treatment, and/or a post-deposition thermal treatment can be performed on the semiconductor nitride layer, metal layer, and/or metal nitride layer to improve the structural integrity of the barrier layers. The post-deposition treatment(s) can increase the material density, etch resistance, and/or resistance to halogen and/or oxygen diffusion of the semiconductor nitride layer, metal layer, and/or metal nitride layer. The presence of high concentration (e.g., greater than about 5 atomic %) of halogen and/or oxygen impurities in the barrier layers can lead to cracks in the barrier layers during subsequent processing of the FET. As a result, the post-deposition treatment(s) can prevent or minimize damages to the barrier layers, thus preventing or minimizing the conductive material leakage between adjacent via structures.

Figure 1B:
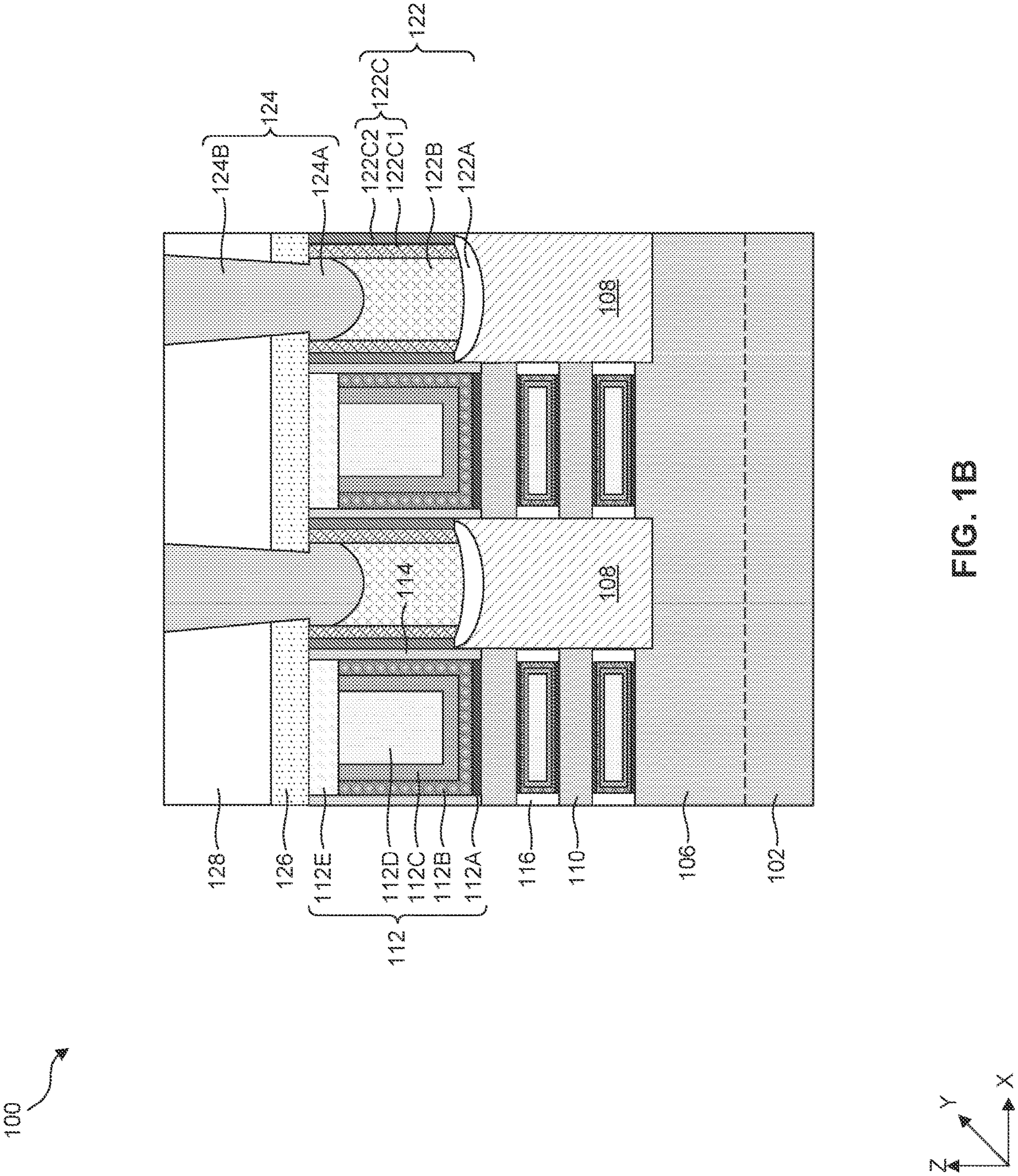
FIGS. 1B and 1C illustrate different cross-sectional views of a semiconductor device with contact structures, in accordance with some embodiments.
Figure 1C:
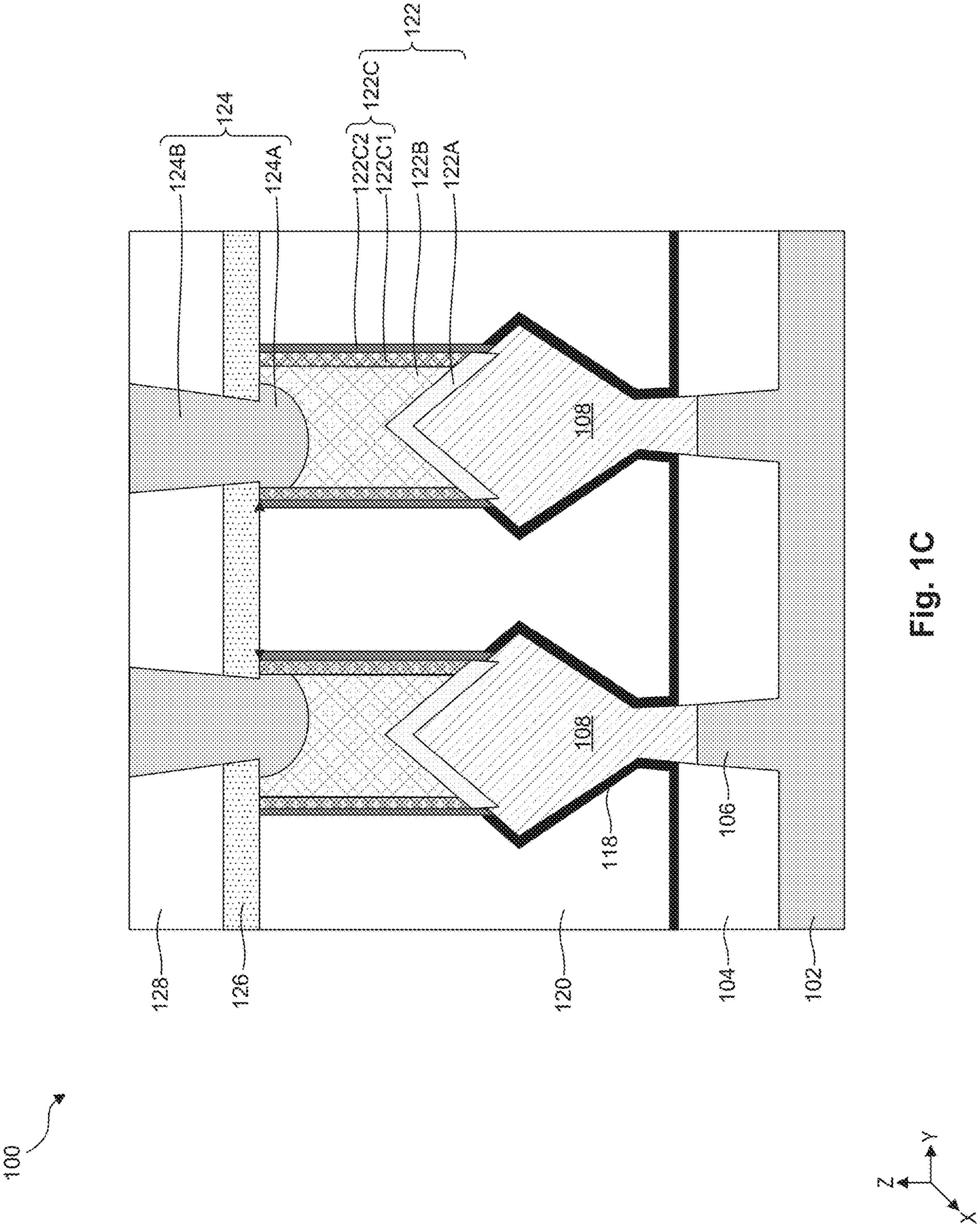

FIG. 1A illustrates an isometric view of a FET 100 (also referred to as a "GAA FET 100"), according to some embodiments. FIG. 1B illustrates a cross-sectional view of FET 100 along line A-A of FIG. 1A, according to some embodiments. FIG. 1C illustrates a cross-sectional view of FET 100, along line B-B of FIG. 1A, according to some embodiments. FIGS. 1B and 1C illustrate cross-sectional views of FET 100 with additional structures that are not shown in FIG. 1A for simplicity. The discussion of elements with the same annotations applies to each other, unless mentioned otherwise.

Referring to FIGS. 1A-1C, in some embodiments, FET 100 can include (i) a substrate 102, (ii) shallow trench isolation (STI) regions 104 disposed on substrate 102, (iii) fin bases 106 disposed on substrate 102, (iv) S/D regions 108 disposed on fin bases 106, (v) nanostructured channel regions 110 disposed on fin bases 106, (vi) gate structures 112 disposed on nanostructured channel regions 110, (vii) outer gate spacers 114, (viii) inner gate spacers 116, (ix) first etch stop layers (ESLs) 118 disposed on S/D regions 108, (x) first interlayer dielectric (TLD) layers 120 disposed on first ESLs 118, (xi) contact structures 122 disposed on S/D regions 108, (xii) via structures 124 disposed on contact structures 122, (xiii) a second ESL 126 disposed on first ILD layers 120, and (xiv) second ILD layer 128 disposed on second ESL 126. As used herein, the term "nanostructured" defines a structure, layer, and/or region as having a horizontal dimension (e.g., along an X- and/or Y-axis) and/or a vertical dimension (e.g., along a Z-axis) less than about 100 nm, for example about 90 nm, about 50 nm, about 10 nm, or other values less than about 100 nm. In some embodiments, nanostructured channel regions 110 can be in the form of nanosheets, nanowires, nanorods, nanotubes, or other suitable nanostructured shapes.

In some embodiments, substrate 102 can be a semiconductor material, such as silicon, germanium (Ge), silicon germanium (SiGe), a silicon-on-insulator (SOI) structure, and a combination thereof. Further, substrate 102 can be doped with p-type dopants (e.g., boron, indium, aluminum, or gallium) or n-type dopants (e.g., phosphorus or arsenic). In some embodiments, STI regions 104 can include an insulating material, such as silicon oxide ($SiO_2$), silicon nitride (SiN), silicon oxynitride (SiON), silicon carbon nitride (SiCN), silicon oxycarbon nitride (SiOCN), and silicon germanium oxide ($SiGeO_x$). In some embodiments, fin bases 106 can include a material similar to substrate 102. Fin bases 106 can have elongated sides extending along an X-axis.

In some embodiments, S/D regions 108 can include an epitaxially-grown semiconductor material, such as Si, and n-type dopants, such as phosphorus and other suitable n-type dopants. In some embodiments, S/D regions 108 can include an epitaxially-grown semiconductor material, such as Si and SiGe, and p-type dopants, such as boron and other suitable p-type dopants.

In some embodiments, nanostructured channel regions 110 can include semiconductor materials similar to or different from substrate 102. In some embodiments, nanostructured channel regions 110 can include Si, SiAs, silicon phosphide (SiP), SiC, SiCP, SiGe, silicon germanium boron (SiGeB), germanium boron (GeB), silicon-germanium-tin-boron (SiGeSnB), a III-V semiconductor compound, or other suitable semiconductor materials. Though rectangular cross-sections of nanostructured channel regions 110 are shown, nanostructured channel regions 110 can have cross-sections of other geometric shapes (e.g., circular, elliptical, triangular, or polygonal). In some embodiments, FET 100 can be a finFET and can have fin regions (not shown) instead of nanostructured channel regions 110.

In some embodiments, gate structures 112 can surround each of nanostructured channel regions 110. In some embodiments, gate structure 112 can be electrically isolated from adjacent contact structure 122 by outer gate spacers 114 and the portions of gate structures 112 surrounding nanostructured channel regions 110 can be electrically isolated from adjacent S/D regions 108 by inner gate spacers 116. Outer gate spacers 114 and inner gate spacers 116 can include a material similar to or different from each other. In some embodiments, outer gate spacers 114 and inner gate spacers 116 can include an insulating material, such as $SiO_2$, SiN, SiON, SiCN, SiOCN, and $SiGeO_x$.

In some embodiments, each gate structure 112 can be a multi-layered structure and can surround nanostructured channel regions 110 for which gate structures 112 can be referred to as "GAA structures." In some embodiments, each gate structure 112 can include (i) an interfacial oxide (IL) layer 112A, (ii) a high-k (HK) gate dielectric layer 112B disposed on IL layer 112A, (iii) a work function metal (WFM) layer 112C disposed on HK gate dielectric layer 112B, (iv) a gate metal fill layer 112D disposed on WFM layer 112C, and (v) a conductive capping layer 112E disposed on gate metal fill layer 112D. In some embodiments, IL layer 112A can include SiO2, SiGeOx, or germanium oxide (GeOx). In some embodiments, HK gate dielectric layer 112B can include a high-k dielectric material, such as hafnium oxide (HfO2), titanium oxide (TiO2), hafnium zirconium oxide (HfZrO), tantalum oxide (Ta2O3), hafnium silicate ($HfSiO4$), zirconium oxide ($ZrO2$), and zirconium silicate ($Z_rS_iO_4$). In some embodiments, WFM layer 112C can include titanium aluminum (TiAl), titanium aluminum carbide (TiAlC), tantalum aluminum (TaAl), tantalum aluminum carbide (TaAlC), Al-doped Ti, Al-doped TiN, Al-doped Ta, Al-doped TaN, or other suitable Al-based materials for GAA NFET 100. In some embodiments, WFM layer 112C can include substantially Al-free (e.g., with no Al) Ti-based or Ta-based nitrides or alloys, such as titanium nitride (TiN), titanium silicon nitride (TiSiN), titanium gold (Ti—Au) alloy, titanium copper (Ti—Cu) alloy, tantalum nitride (TaN), tantalum silicon nitride (TaSiN), tantalum gold (Ta—Au) alloy, and tantalum copper (Ta—Cu) for GAA PFET 100. In some embodiments, gate metal fill layer 112D can include a suitable conductive material, such as tungsten (W), Ti, silver (Ag), ruthenium (Ru), molybdenum (Mo), copper (Cu), cobalt (Co), Al, iridium (Ir), nickel (Ni), metal alloys, and a combination thereof.

Conductive capping layer 112E can provide a conductive interface between gate metal fill layer 112D and a gate contact structure (not shown) to electrically connect gate metal fill layer 112D to the gate contact structure without forming the gate contact structure directly on or within gate metal fill layer 112D. The gate contact structure is not formed directly on or within gate metal fill layer 112D to prevent contamination by any of the processing materials used in the formation of the gate contact structure. Contamination of gate metal fill layer 112D can lead to the degradation of device performance. Thus, with the use of conductive capping layer 112E, gate structure 112 can be electrically connected to the gate contact structure without compromising the integrity of gate structure 112. In some embodiments, conductive capping layer 112E can include a metallic material, such as W, Ru, Mo, Co, other suitable metallic materials, and a combination thereof.

In some embodiments, ESLs 118 can be disposed on portions of S/D regions 108 that are not covered by contact structures 122, and ILD layers 120 can be disposed on ESLs 118. In some embodiments, ESLs 118 and 126 and ILD layers 120 and 128 can include an insulating material, such as $SiO_2$, SiN, SiON, SiCN, SiOCN, and $SiGeO_x$.

In some embodiments, each contact structure 122 can include (i) a silicide layer 122A disposed on S/D region 108, (ii) a contact plug 122B disposed on silicide layer 122A, and (iii) a barrier layer 122C surrounding contact plug 122B. In some embodiments, each silicide layer 122A can include titanium silicide ($Ti_xSi_y$), tantalum silicide ($Ta_xSi_y$), molybdenum ($Mo_xSi_y$), zirconium silicide ($Zr_xSi_y$), hafnium silicide ($Hf_xSi_y$), scandium silicide ($Sc_xSi_y$), yttrium silicide ($Y_xSi_y$), terbium silicide ($Tb_xSi_y$), lutetium silicide ($Lu_xSi_y$), erbium silicide ($Er_xSi_y$), ytterbium silicide ($Yb_xSi_y$), europium silicide ($Eu_xSi_y$), thorium silicide ($Th_xSi_y$), other suitable metal silicide materials, or a combination thereof for GAA NFET 100. In some embodiments, each silicide layer 122A can include nickel silicide ($Ni_xSi_y$), cobalt silicide ($Co_xSi_y$), manganese silicide ($Mn_xSi_y$), tungsten silicide ($W_xSi_y$), iron silicide ($Fe_xSi_y$), rhodium silicide ($Rh_xSi_y$), palladium silicide ($Pd_xSi_y$), ruthenium silicide ($Ru_xSi_y$), platinum silicide ($Pt_xSi_y$), iridium silicide ($Ir_xSi_y$), osmium silicide ($Os_xSi_y$), other suitable metal silicide materials, or a combination thereof for GAA PFET 100. In some embodiments, each contact plug 122B can include conductive materials with low resistivity (e.g., resistivity of about 50 μΩ-cm, about 40 μΩ-cm, about 30 μΩ-cm, about 20 μΩ-cm, or about 10 μΩ-cm), such as Co, W, Ru, Al, Mo, iridium (Ir), nickel (Ni), Osmium (Os), rhodium (Rh), other suitable conductive materials with low resistivity, and a combination thereof.

Barrier layers 122C can surround contact plugs 122B and can prevent the oxidation of contact plugs 122B by preventing the diffusion of oxygen atoms from adjacent structures (e.g., ILD layers 120) to contact plug 122B. Barrier layers 122C can have high material density to be highly resistant to etching and to diffusion of halogen atoms from etching chemicals during the formation of via structures 124, described in detail below. In some embodiments, the high material density of barrier layers 122C can limit the concentration of halogen atoms in barrier layers 122C less than about 5 atomic %. The presence of high concentration (e.g., greater than about 5 atomic %) halogen atoms in barrier layers 122C can lead to cracks in them during subsequent thermal processing of FET 100. These cracks can lead to conductive material leakage from contact plugs 122B into ILD layers 120, thus forming current leakage paths and damaging the electrical isolation between contact structures 122. The high material density of barrier layers 122C can also prevent or minimize material loss of barrier layers 122C, and as a result prevent or minimize thinning of barrier layers 122C during etching processes involved in the formation of via structures 124, described in detail below. Thinning of barrier layers 122C below a thickness of about 2 nm can also lead to conductive material leakage and the formation of a current leakage paths between contact structures 122 through ILD layers 120. In some embodiments, top surfaces of contact plugs 122B, barrier layers 122C, and conductive capping layers 112E can be substantially coplanar with each other.

In some embodiments, each barrier layer 122C can include a metal nitride layer 122C1 disposed directly on contact plug 122B and a semiconductor nitride layer 122C2 disposed directly on metal nitride layer 122C1. In some embodiments, each barrier layer 122C can include a metal layer (not shown) disposed between metal nitride layer 122C1 and semiconductor nitride layer 122C2. In some embodiments, metal nitride layer 122C1 can include an electrically conductive transition metal nitride, such as titanium nitride (TiN), zirconium nitride (ZrN), hafnium nitride (HfN), molybdenum nitride (MoN), vanadium nitride (VN), tantalum nitride (TaN), and tungsten nitride (WN). In some embodiments, metal nitride layer 122C1 and silicide layer 122A can include the same metal. In some embodiments, semiconductor nitride layer 122C2 can include an insulating material, such as SiN, SiON, SiCN, SiOCN, and other suitable dielectric nitride materials. In some embodiments, metal nitride layer 122C1 may not be present in each barrier layer 122C.

In some embodiments, via structures 124 can be liner-free and can include a metallic material, such as W, Ru, Mo, Co, other suitable metallic materials, and a combination thereof. In some embodiments, a top surface of second ILD layer 128 can be substantially coplanar with top surfaces of via structures 124. In some embodiments, each via structure 124 can include a via-base 124A and a via-top 124B. Via-bases 124A can be disposed in contact structures 122 and via-tops 124B can extend over top surfaces of contact plugs 122B. In some embodiments, top surfaces of via-bases 124A can be substantially coplanar with top surfaces of contact plugs 122B. In some embodiments, via-bases 124A can have a height of about 3 nm to about 15 nm. Within this range of height, via-bases 124A can form an adequate conductive interface with contact plugs 122B and minimize contact resistance between via structures 124 and contact structures 122. In some embodiments, via-bases 124A can have semi-spherical shapes or arcuate shapes that are wider than the width of via-tops 124B. Since via structures 124 are formed without adhesion liners, the wider semi-spherical shaped or arcuate shaped via-bases 124A can prevent the metallic material of via structures 124 from being pulled out from via openings 1424 (shown in FIGS. 14A and 14B) formed in contact structures 122 during the formation of via structures 124.

In some embodiments, top portions of barrier layers 122C can surround via-bases 124A and second ESL 126 and second ILD layer 128 can surround via-tops 124B. The structural and material properties of barrier layers 122C can prevent the formation of a current leakage paths between via-bases 124A through ILD layers 120, as discussed for contact plugs 122B. In some embodiments, the portions of barrier layers 122C in contact with via-bases 124A can have halogen atom concentration of about 1 atomic % to about 5 atomic % and the portions of barrier layers 122C not in contact with via-bases 124A can have halogen atom concentration of about 0 atomic % to about 0.5 atomic %. The difference in halogen atom concentration in different regions of barrier layers 122C can be due to the different levels of exposure to etching chemicals during the formation of via structures 124, described in detail below.

Figure 2:
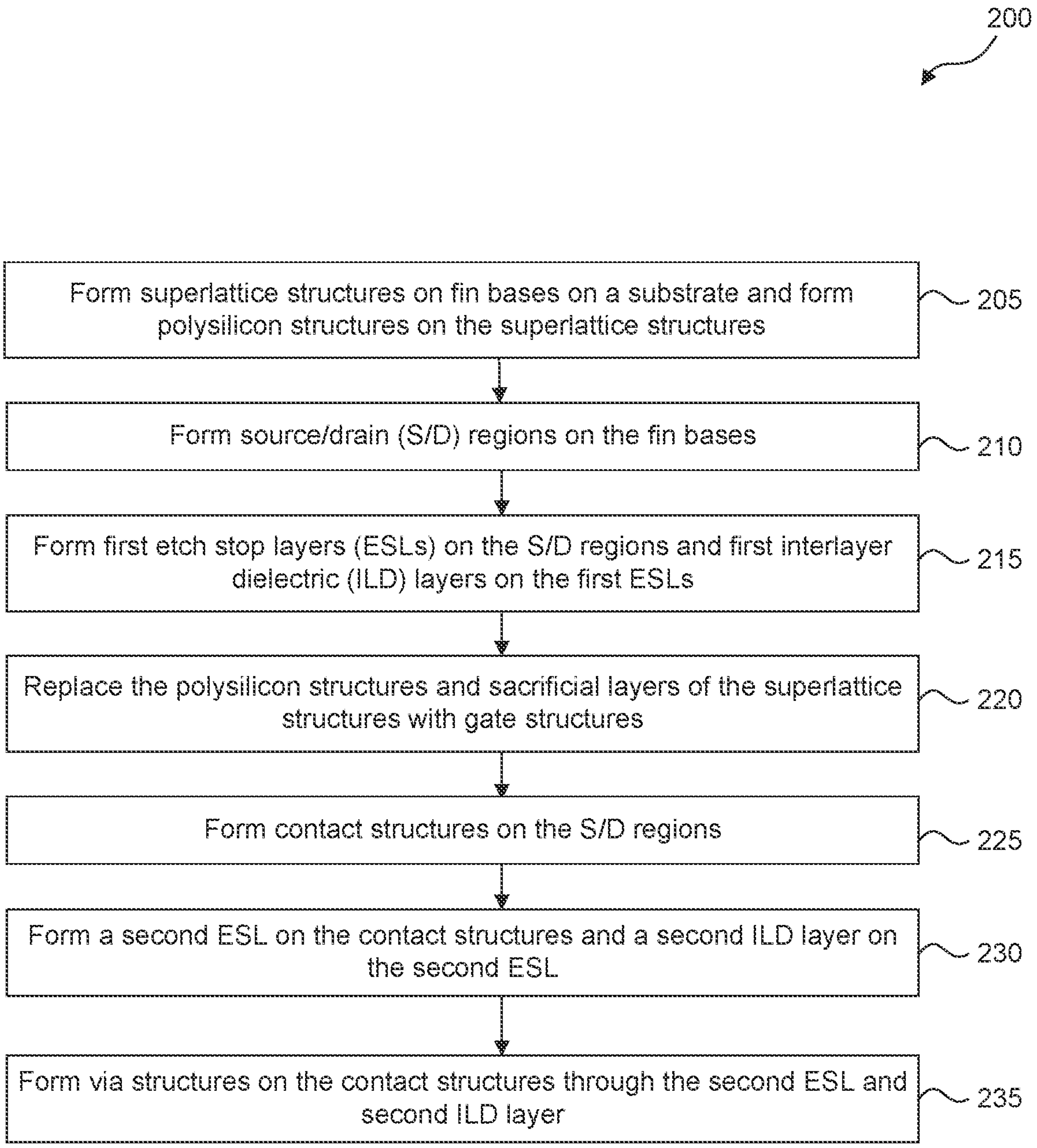
FIG. 2 is a flow diagram of a method for fabricating a semiconductor device with contact structures, in accordance with some embodiments.

FIG. 2 is a flow diagram of an example method 200 for fabricating FET 100, according to some embodiments. For illustrative purposes, the operations illustrated in FIG. 2 will be described with reference to the example fabrication process for fabricating FET 100 as illustrated in FIGS. 3A-15B. FIGS. 3A-15A are cross-sectional views of FET 100 along line A-A of FIG. 1A at various stages of fabrication, according to some embodiments. FIGS. 3B-15B are cross-sectional views of FET 100 along line B-B of FIG. 1A at various stages of fabrication, according to some embodiments. Operations can be performed in a different order or not performed depending on specific applications. It should be noted that method 200 may not produce a FET 100. Accordingly, it is understood that additional processes can be provided before, during, and after method 200, and that some other processes may only be briefly described herein. Elements in FIGS. 3A-15B with the same annotations as elements in FIGS. 1A-1C are described above.

Referring to FIG. 2, in operation 205, superlattice structures are formed on fin bases on a substrate and polysilicon structures are formed on the superlattice structures. For example, as described with reference to FIGS. 3A and 3B, superlattice structures 311 are formed on fin bases 106 on substrate 102 and polysilicon structures 312 are formed on superlattice structures 311. Superlattice structures 311 and polysilicon structures 312 are not visible in the cross-sectional view of FIG. 3B. In some embodiments, superlattice structure 311 can include epitaxially-grown nanostructured layers 110 and 310 arranged in an alternating configuration. In some embodiments, nanostructured layers 110 can include Si without any substantial amount of Ge (e.g., with no Ge) and nanostructured layers 310 can include SiGe. Nanostructured layers 310 are also referred to as sacrificial layers 310.

Figure 3A:
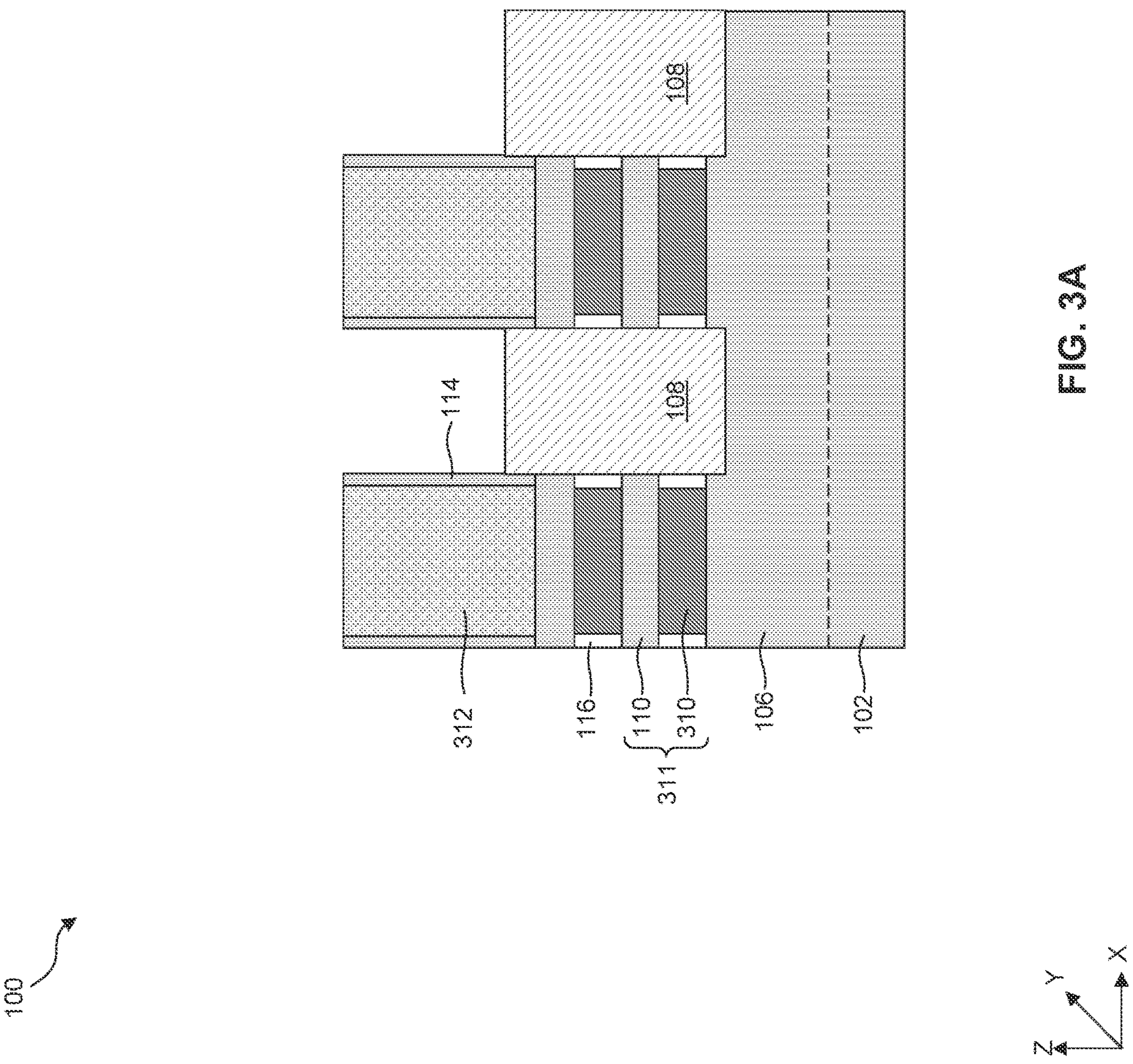
Figure 3B:
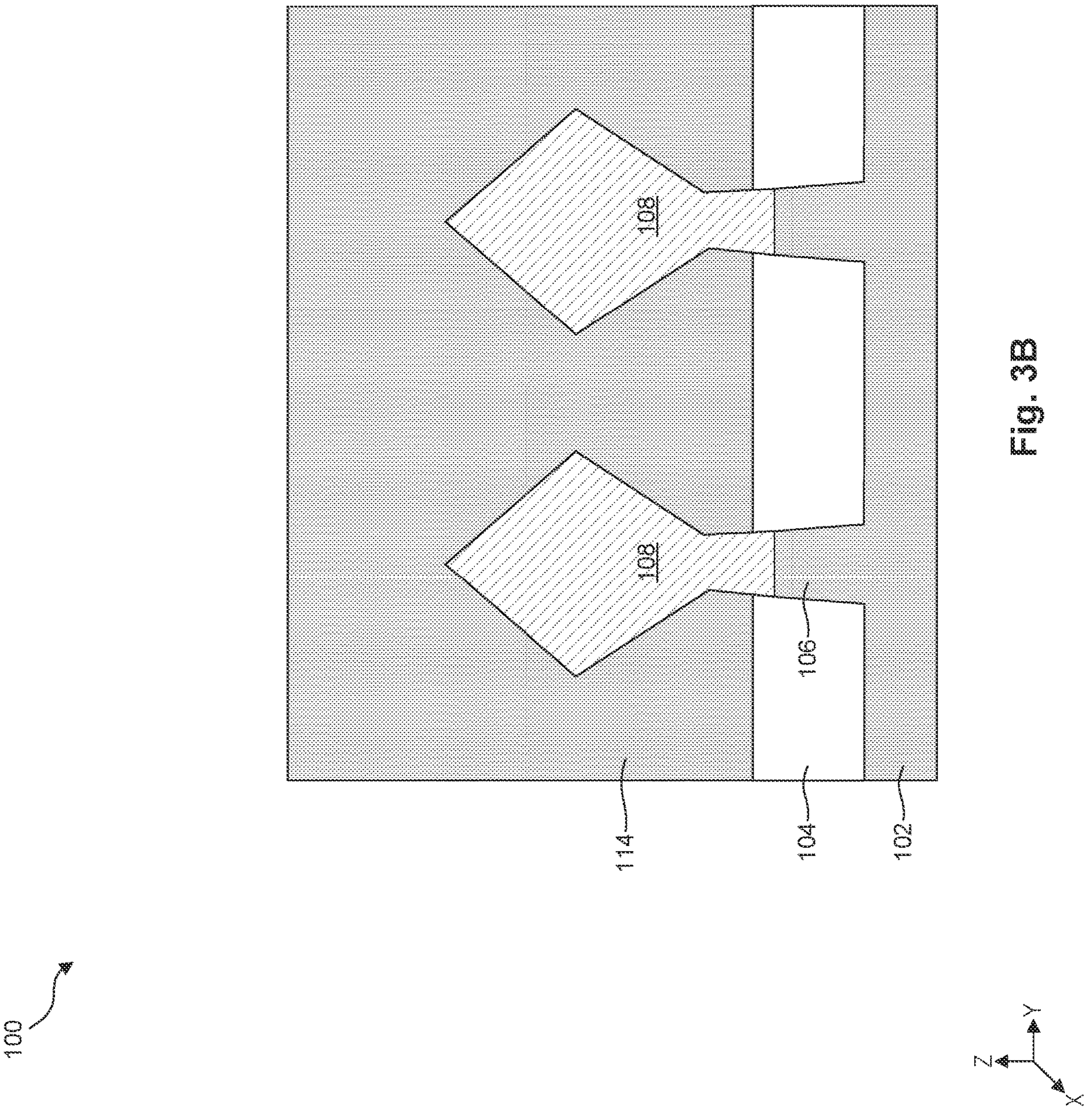
Figure 4A:
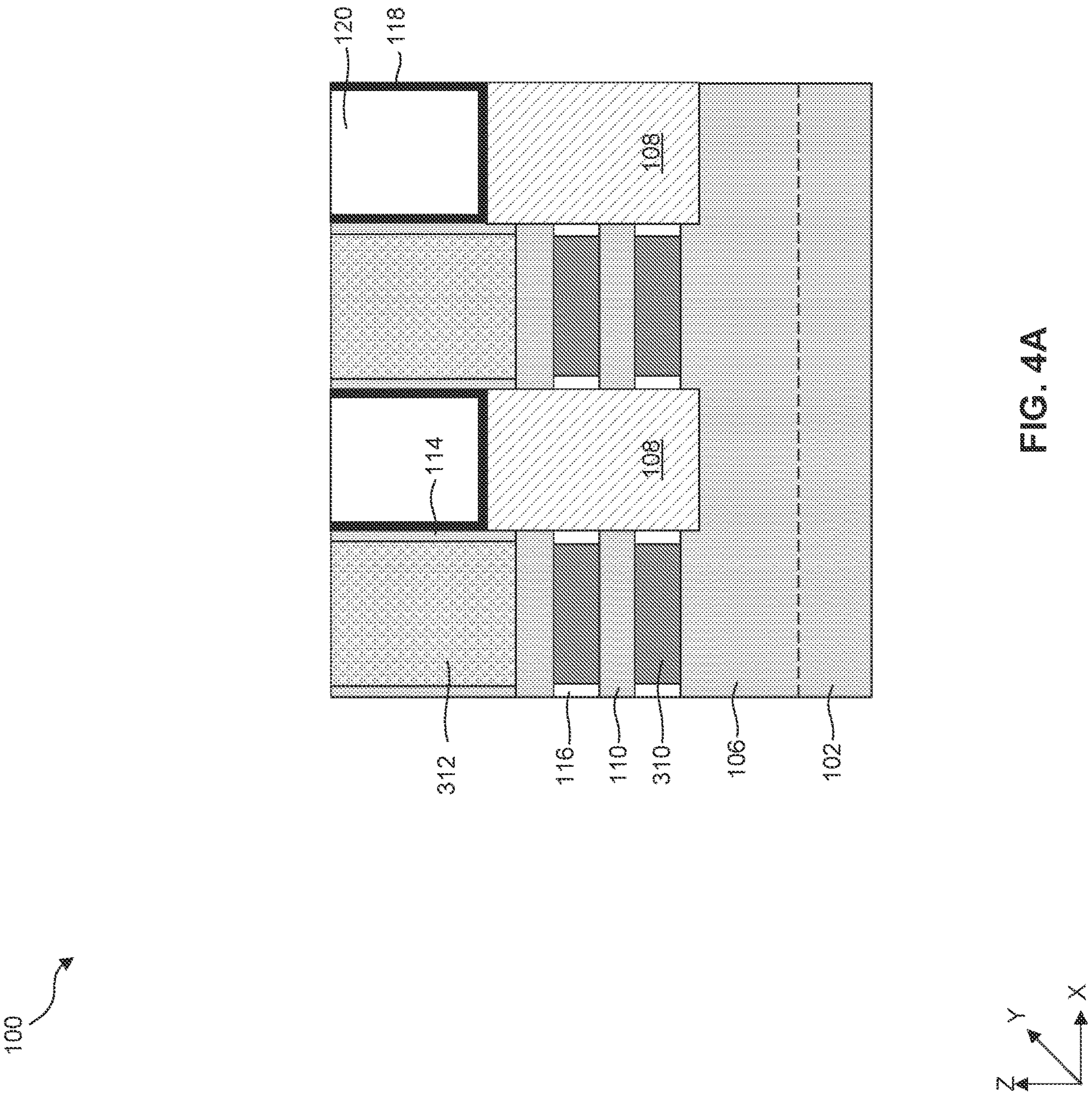
Figure 4B:
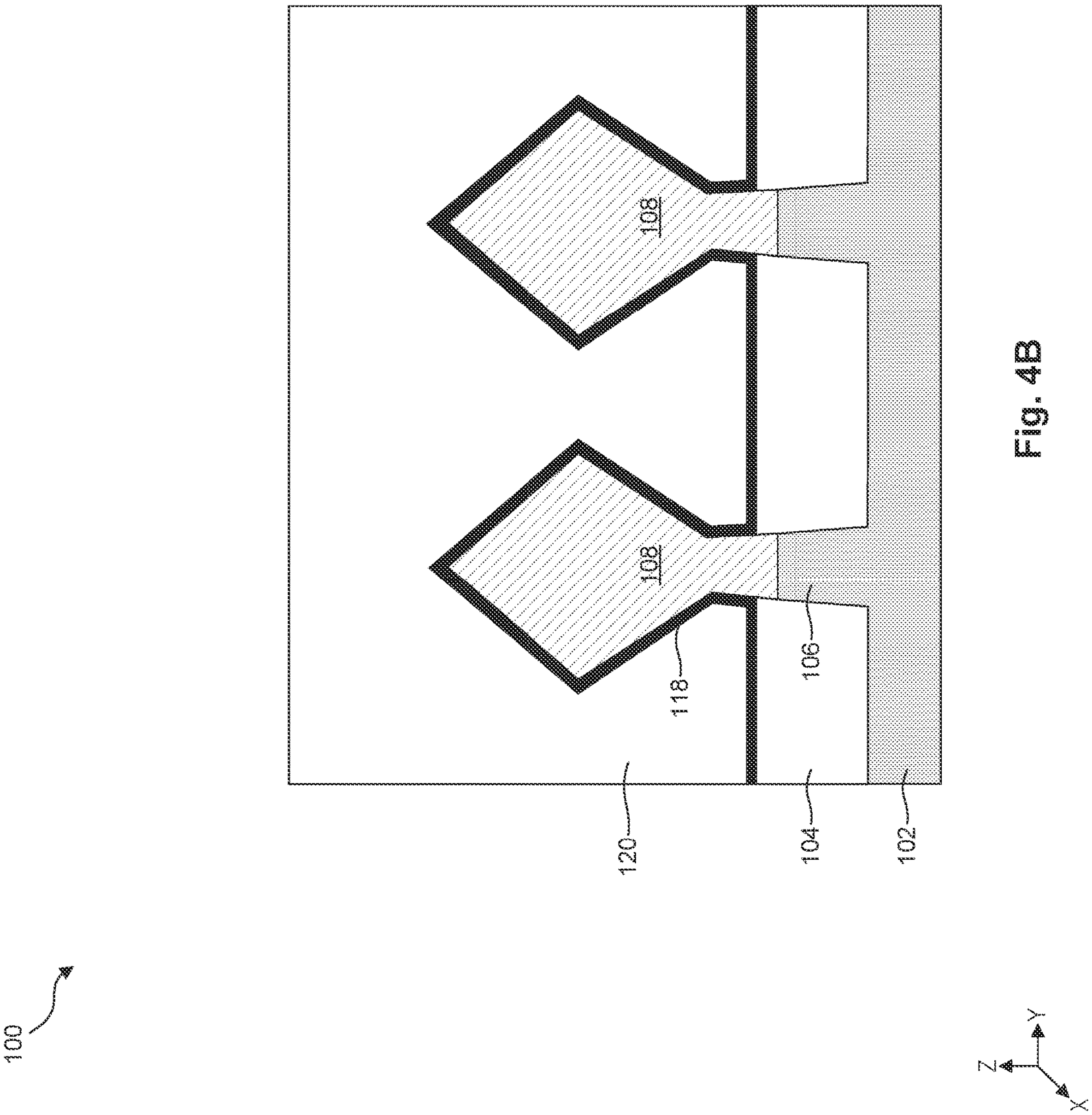

The formation of polysilicon structures 312 can include sequential operations of (i) depositing a polysilicon layer (not shown) on superlattice structures 311 and (ii) performing a patterning process (e.g., lithography process) on the polysilicon layer to form polysilicon structures 312, as shown in FIG. 3A. In some embodiments, outer gate spacers 114 can be formed after the formation of polysilicon structures 312. During subsequent processing, sacrificial layers 310 and polysilicon structures 312 can be replaced in a gate replacement process to form gate structures 112.

Referring to FIG. 2, in operation 210, S/D regions are formed on the fin bases. For example, as described with reference to FIGS. 3A and 3B, S/D regions 108 are formed on portions of fin bases 106 that are non-overlapping with polysilicon structures 312. The formation of S/D regions 108 can include forming S/D openings (not shown) on fin bases 106 and epitaxially growing semiconductor material on exposed portions of fin bases 106 in the S/D openings. In some embodiments, inner gate spacers 116 can be formed after the formation of S/D openings and prior to the epitaxial growth of the semiconductor material.

Referring to FIG. 2, in operation 215, first ESLs are formed on the S/D regions and first ILD layers are formed on the first ESLs. For example, as described with reference to FIGS. 4A and 4B, ESLs 118 are formed on S/D regions 108 and ILD layers 120 are formed on ESLs 118. The formation of ESLs 118 and ILD layers 120 can include (i) depositing insulating layers (not shown) on the structures of FIGS. 3A and 3B, and (ii) performing a chemical mechanical polishing (CMP) process on the insulating layers to substantially coplanarize top surfaces of ESLs 118 and ILD layers 120 with top surfaces of polysilicon structures 312.

Figure 5A:
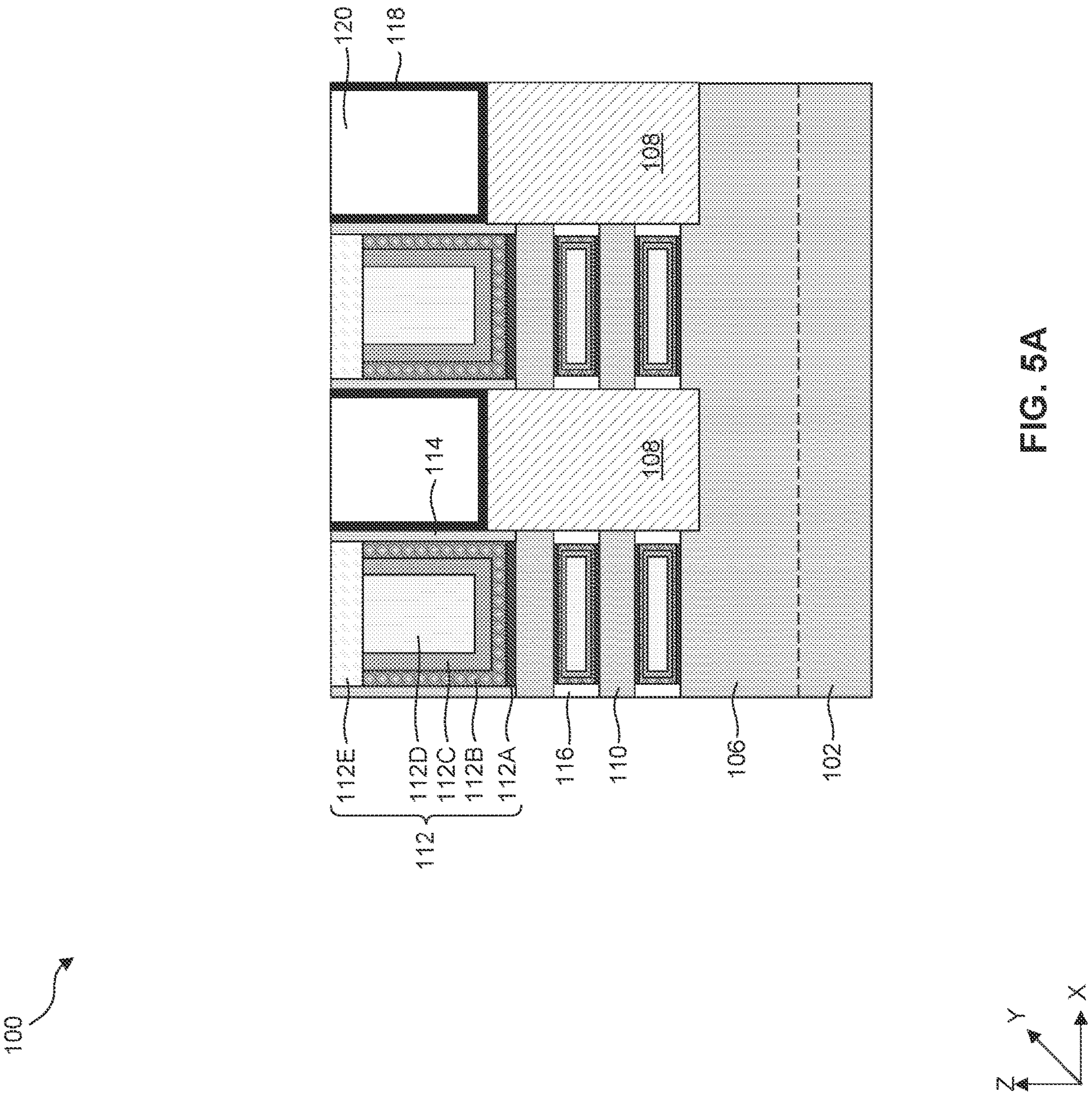
Figure 5B:
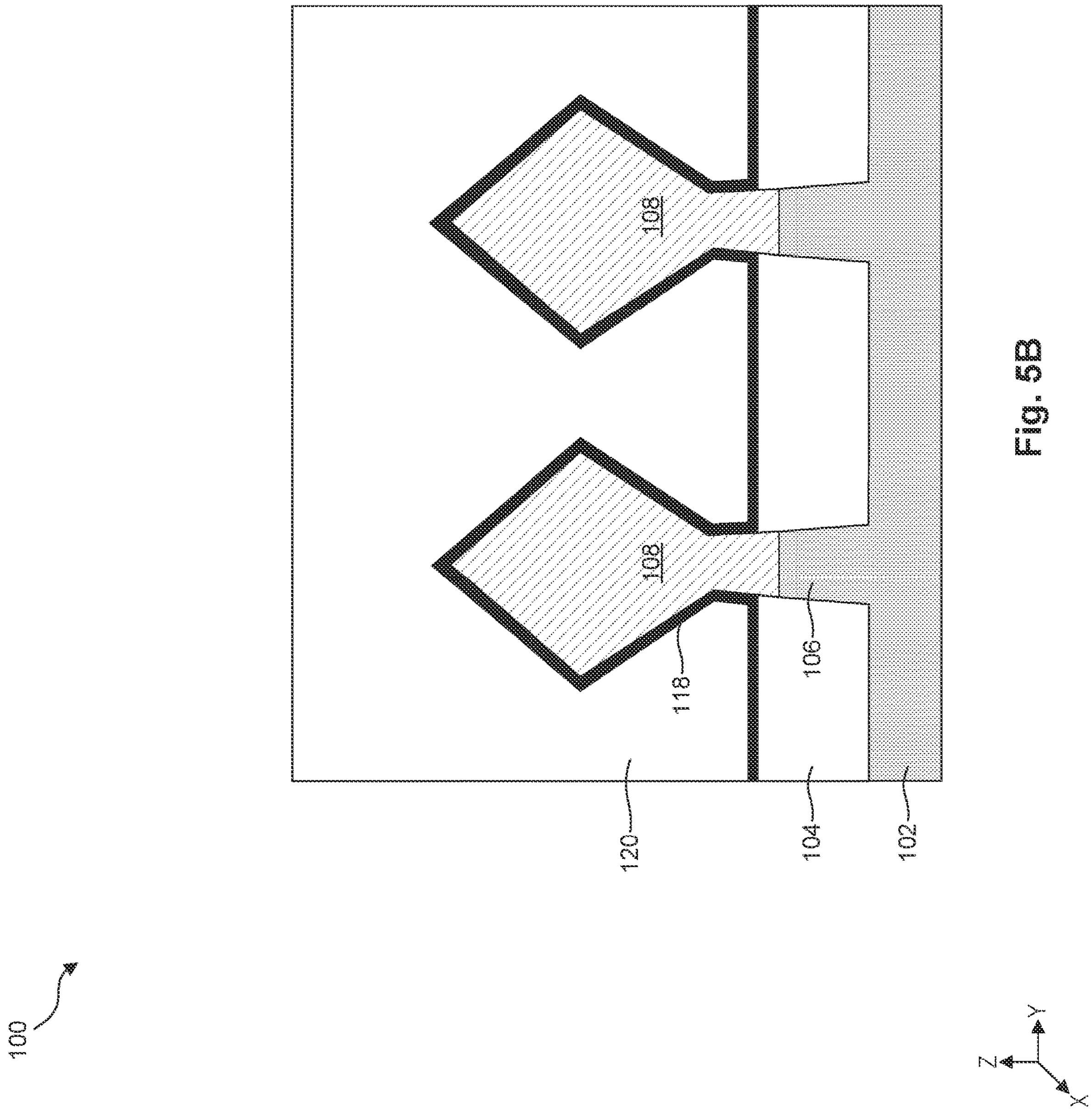

Referring to FIG. 2, in operation 220, polysilicon structures and sacrificial layers of the superlattice structures are replaced with gate structures. For example, as described with reference to FIGS. 5A and 5B, polysilicon structures 312 and sacrificial layers 310 are replaced with gate structures 112. Gate structures 112 are not visible in the cross-sectional view of FIG. 5B. The replacement of polysilicon structures 312 and sacrificial layers 310 with gate structures 112 can include sequential operations of (i) etching polysilicon structures 312 from the structure of FIG. 4A, (ii) etching sacrificial layers 310 from the structure of FIG. 4A, (iii) forming IL layers 112A, as shown in FIG. 5A, by performing an oxidation process on the surfaces of nanostructured layers 110 exposed (not shown) after the etching of polysilicon structures 312 and sacrificial layers 310, (iv) depositing a dielectric layer (not shown) having the material of HK gate dielectric layer 112B on IL layers 112A, (v) depositing a conductive layer (not shown) having the material of WFM layers 112C on the dielectric layer, (vi) depositing a conductive fill layer (not shown) having the material of gate metal fill layers 112D on the conductive layer, (vii) performing a CMP process on the dielectric layer, the conductive layer, and the conductive fill layer to form HK gate dielectric layers 112B, WMF layers 112C, and gate metal fill layers 112D with their top surfaces substantially coplanarized (not shown) with top surfaces of ESLs 118 and ILD layers 120, (viii) etching HK gate dielectric layers 112B, WMF layers 112C, and gate metal fill layers 112D to form recesses (not shown), (ix) depositing a conductive layer (not shown) having the material of conductive capping layers 112E in the recesses and on ESLs 118 and ILD layers 120, and (x) performing a CMP process on the conductive layer to form the structure of FIG. 5A.

Figure 6A:
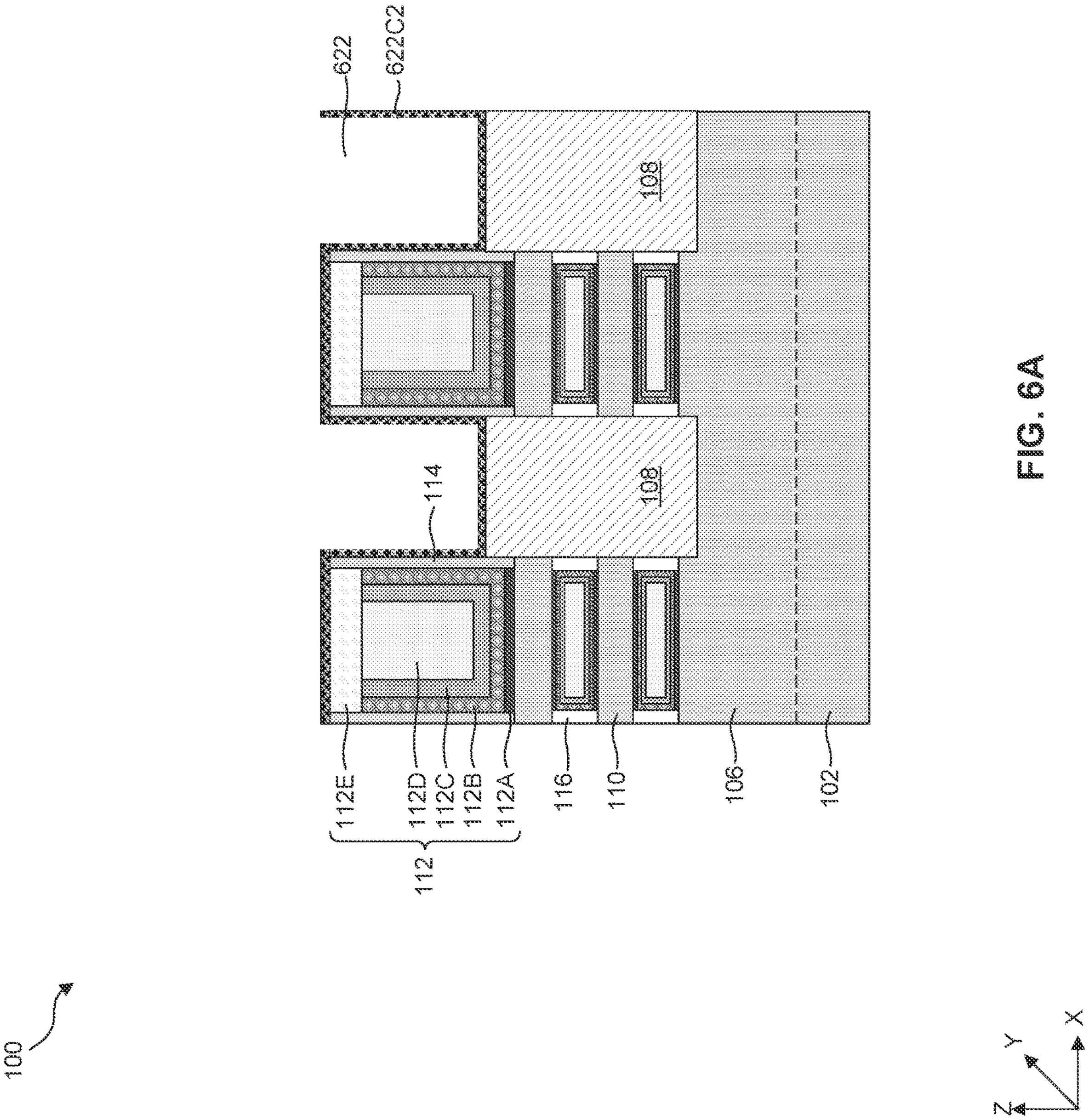
Figure 6B:
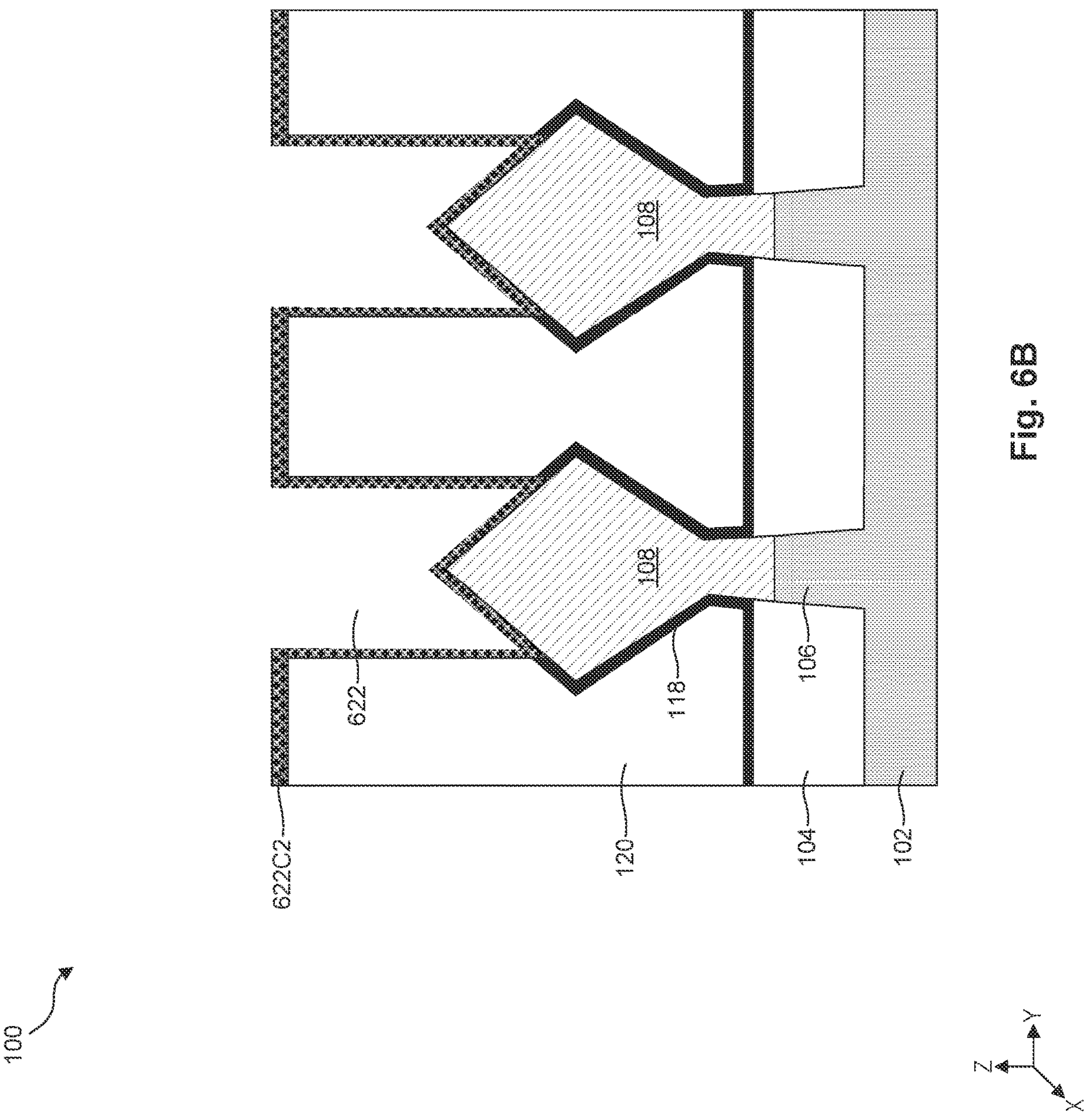
Figure 7A:
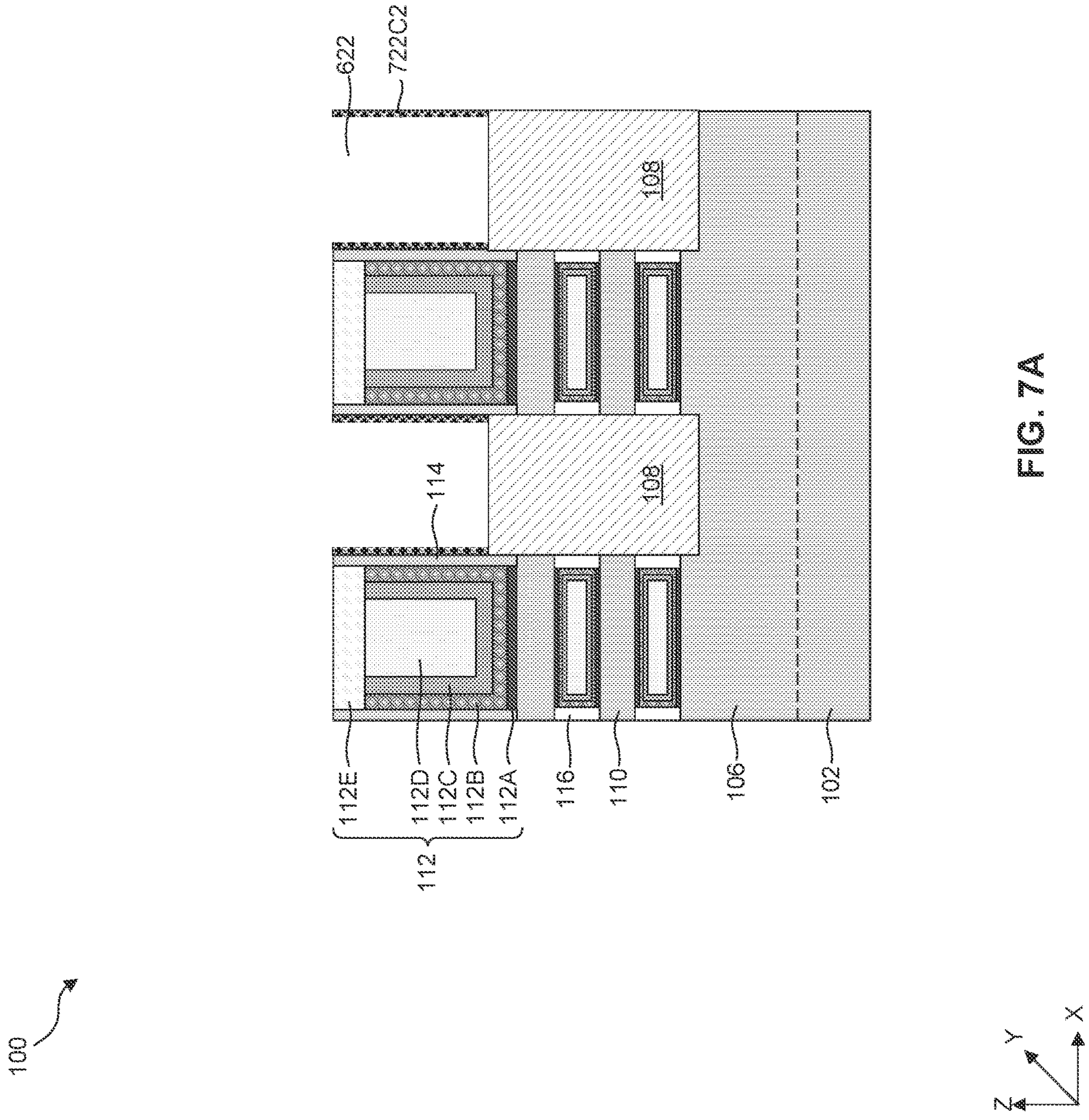
Figure 7B:
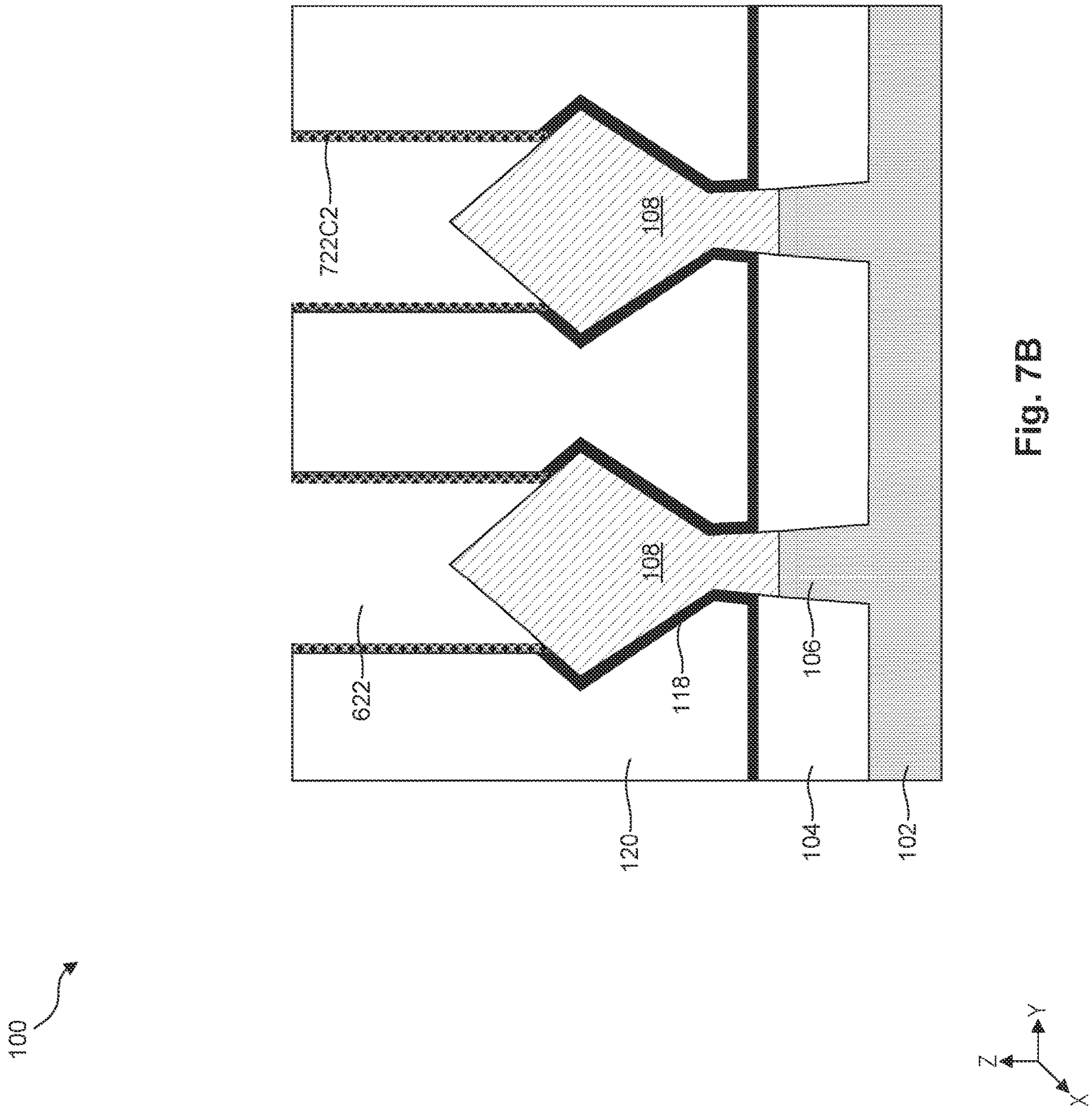
Figure 8A:
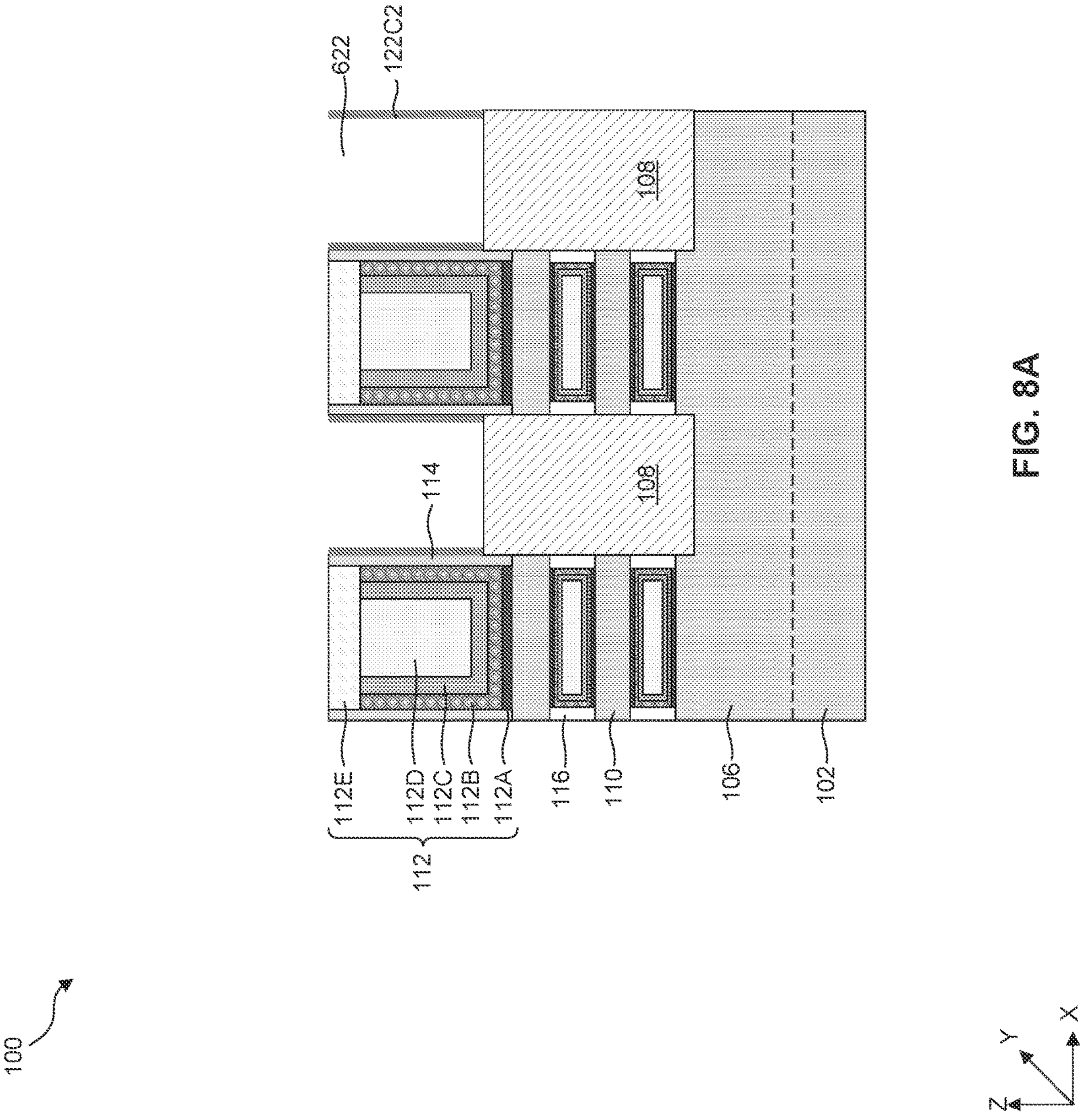
Figure 8B:
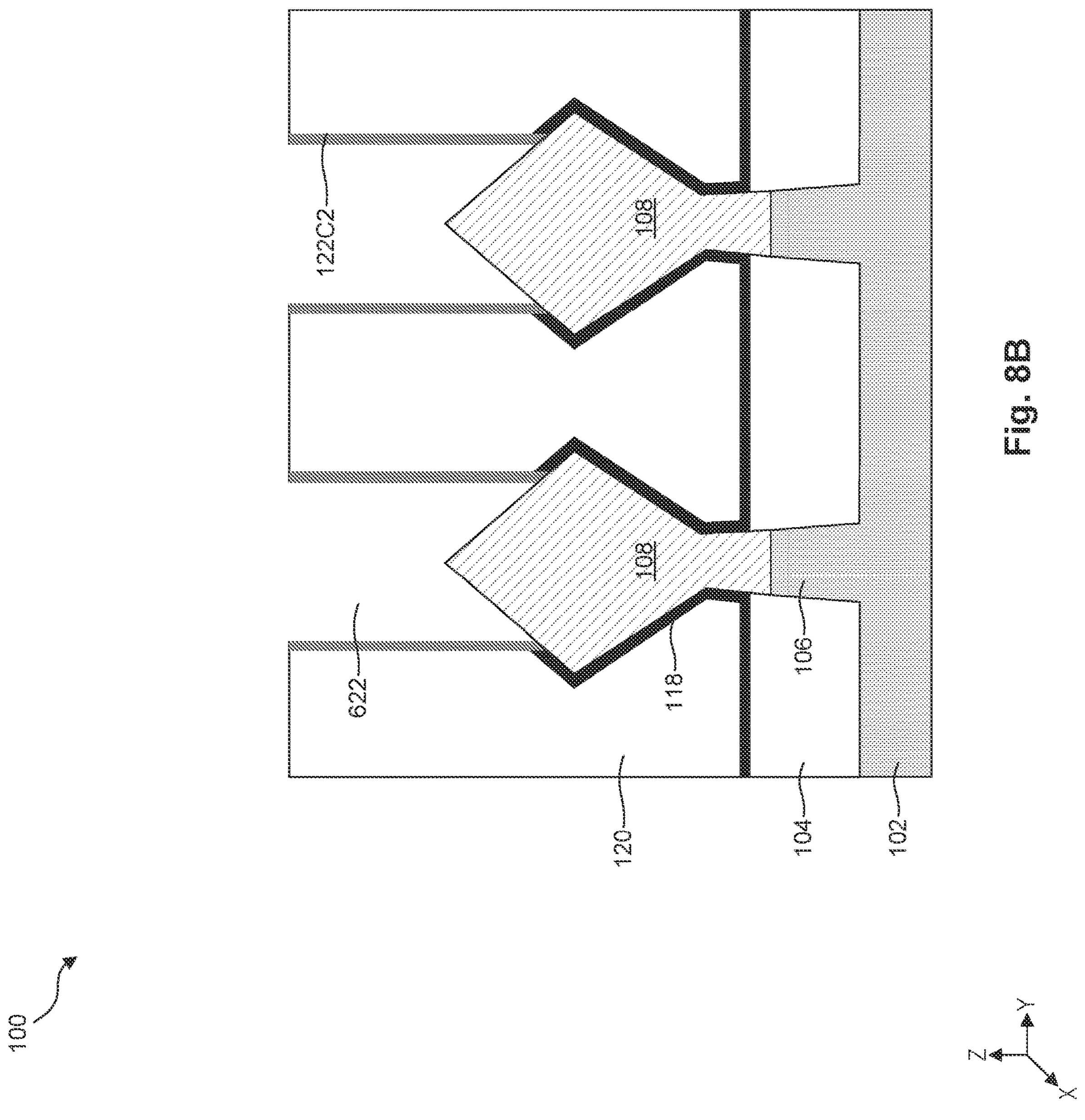
Figure 9A:
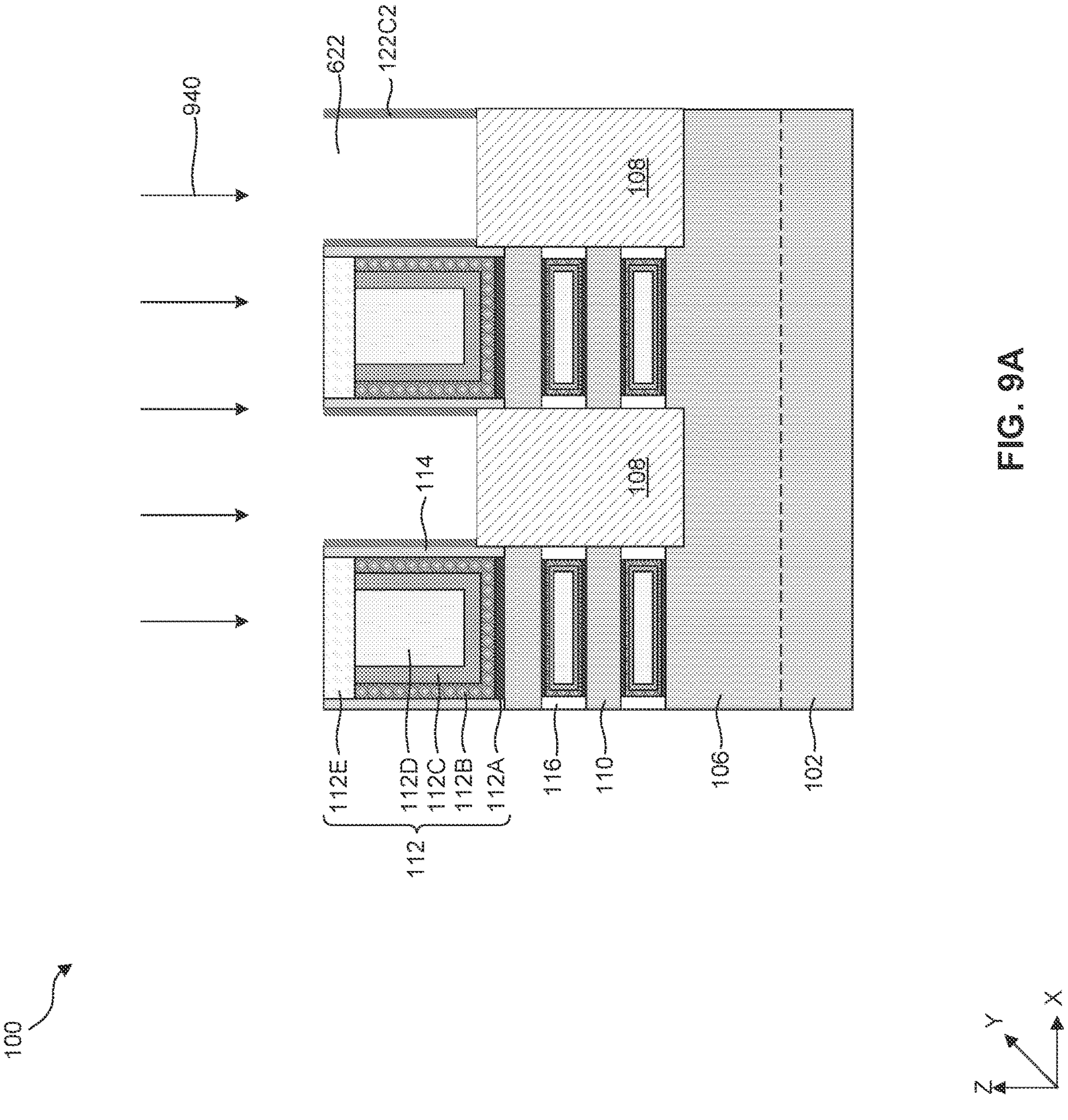
Figure 9B:
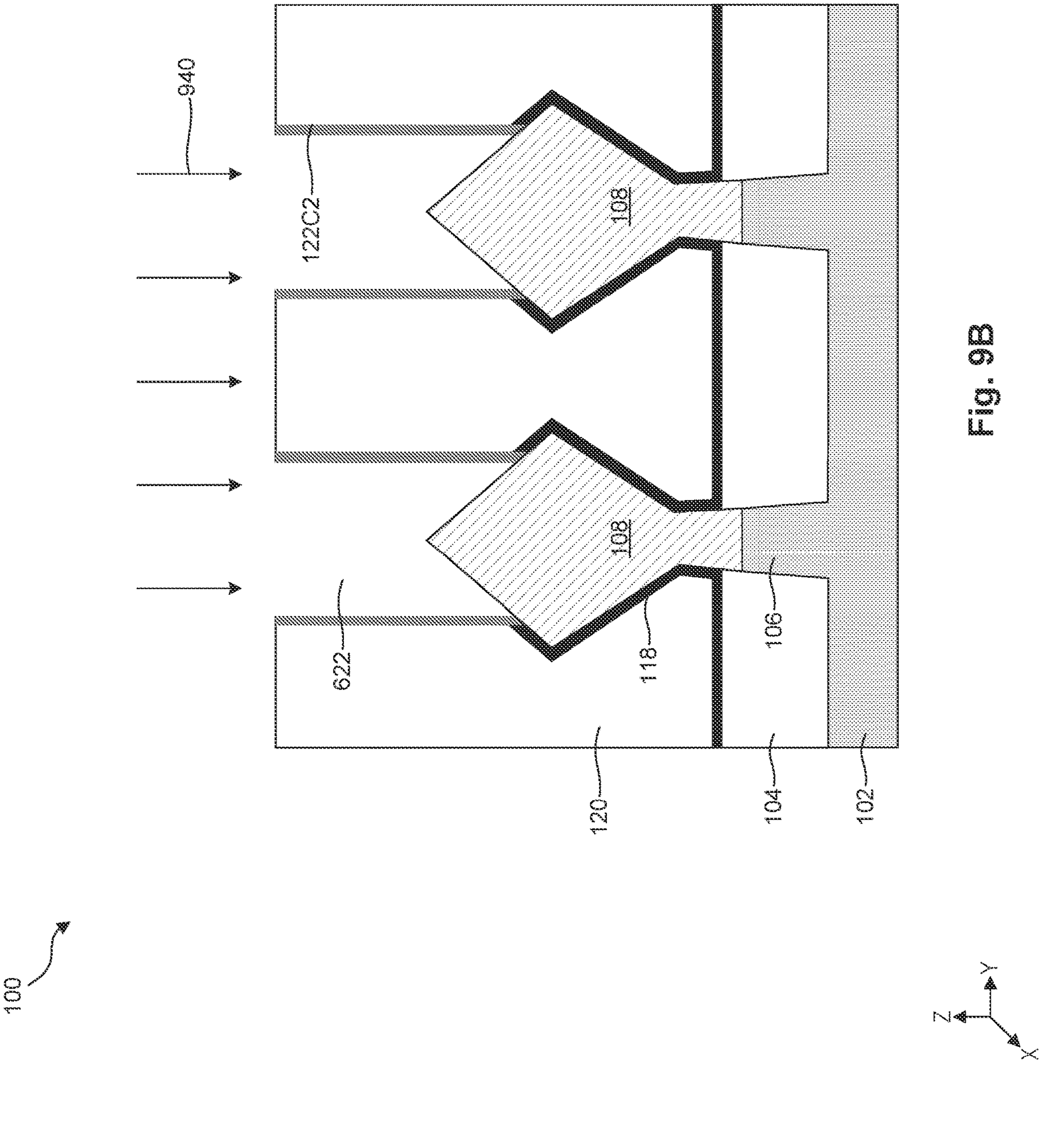
Figure 10A:
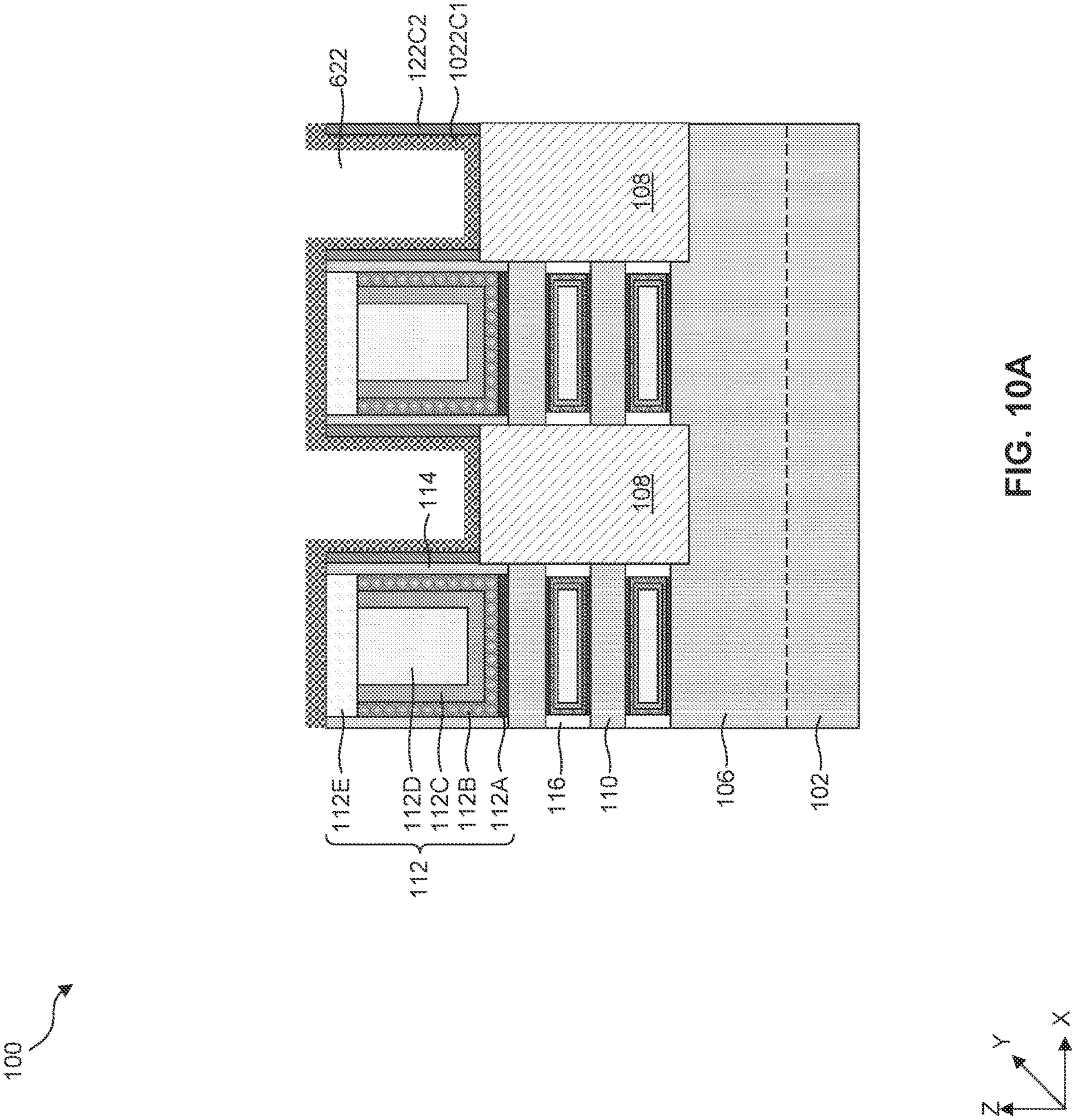
Figure 10B:
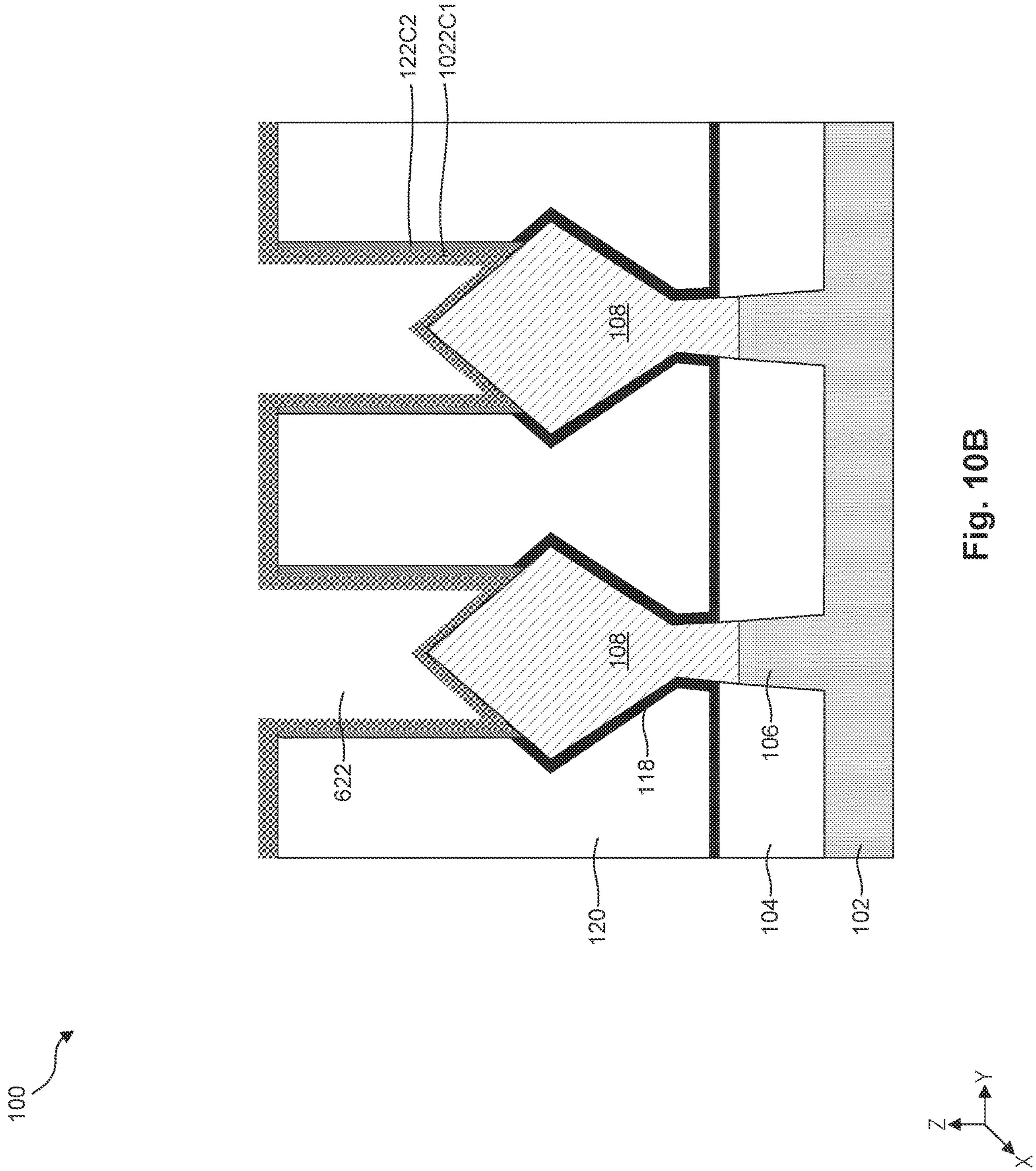
Figure 11A:
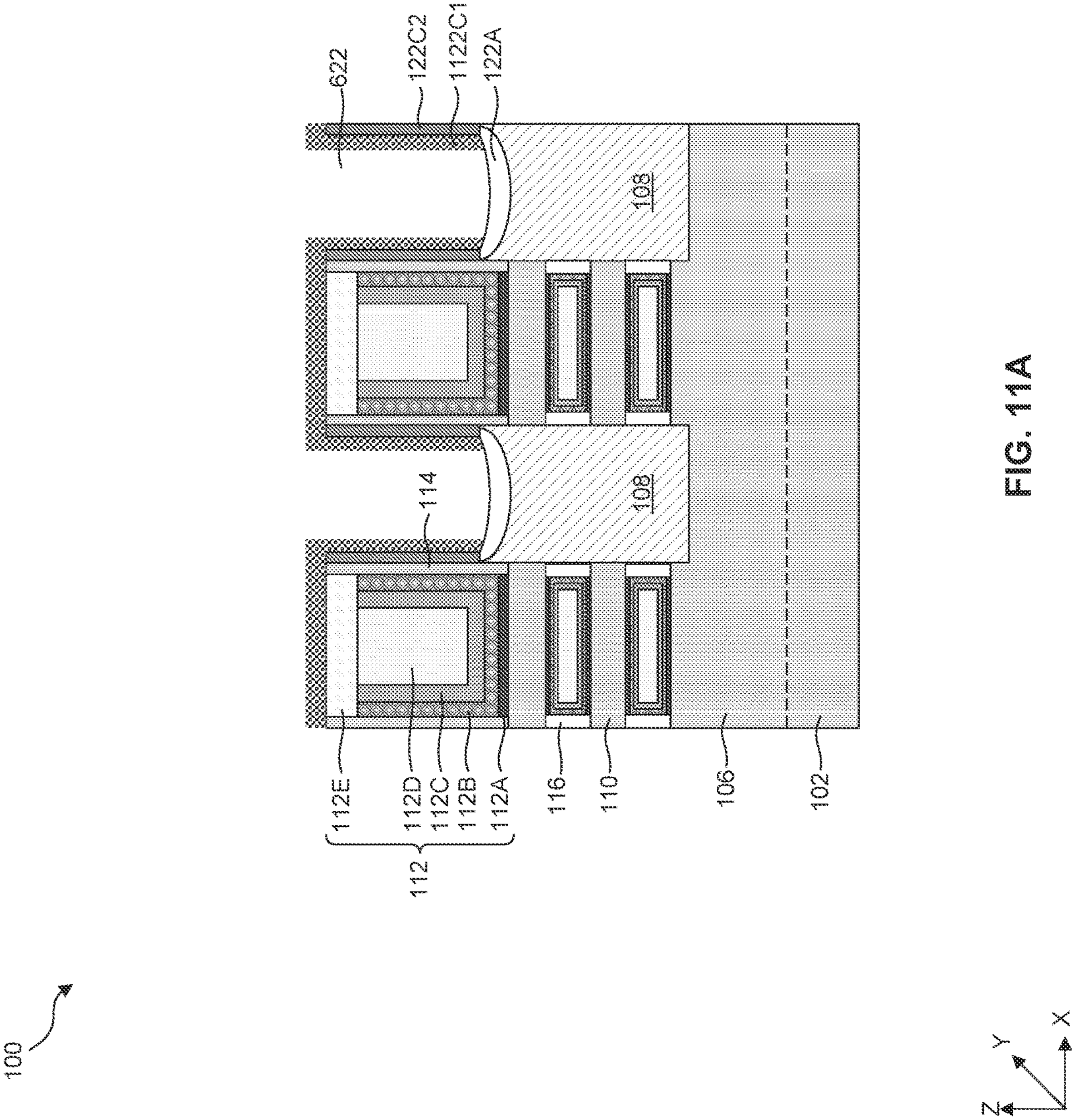
Figure 11B:
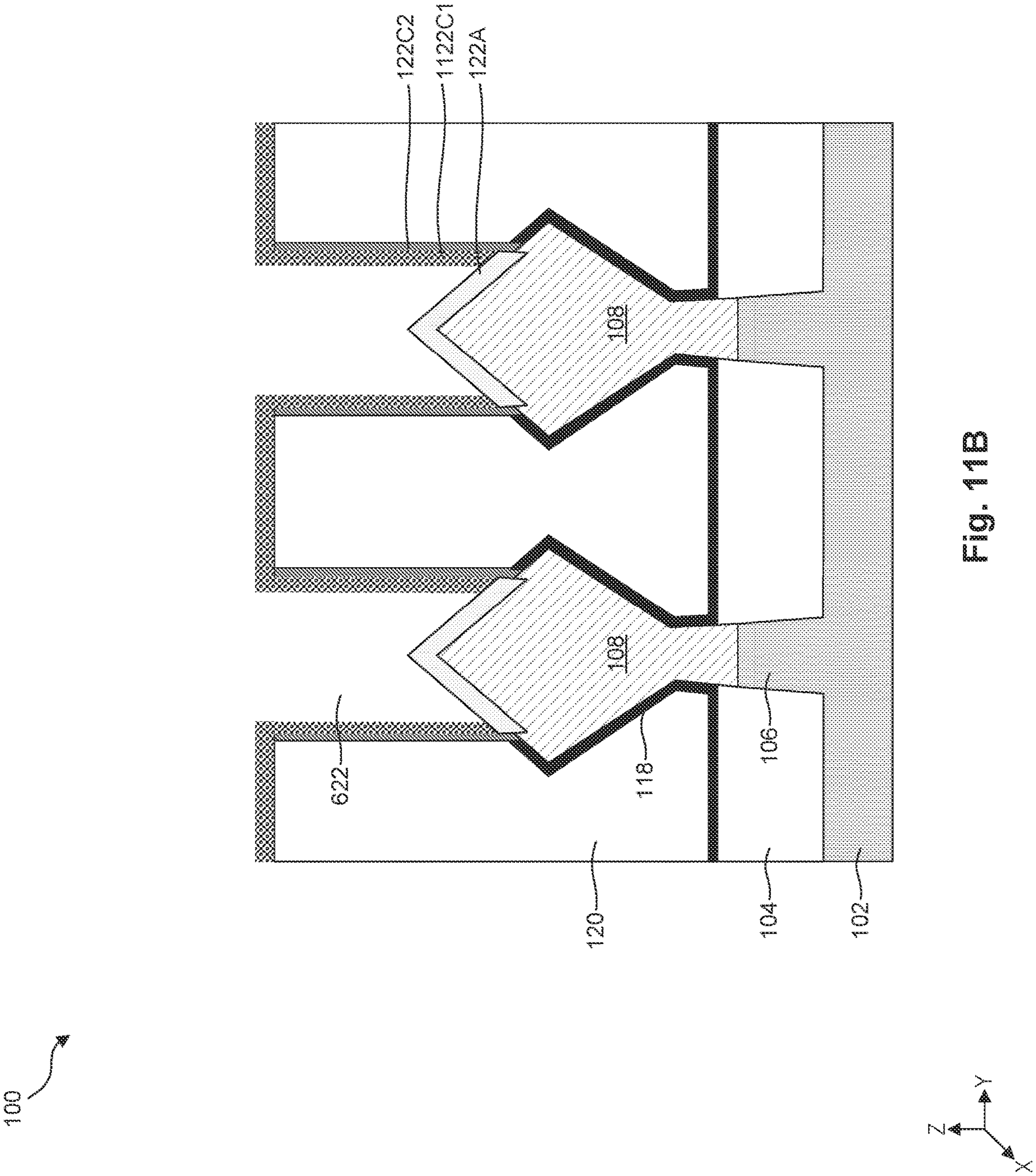
Figure 12A:
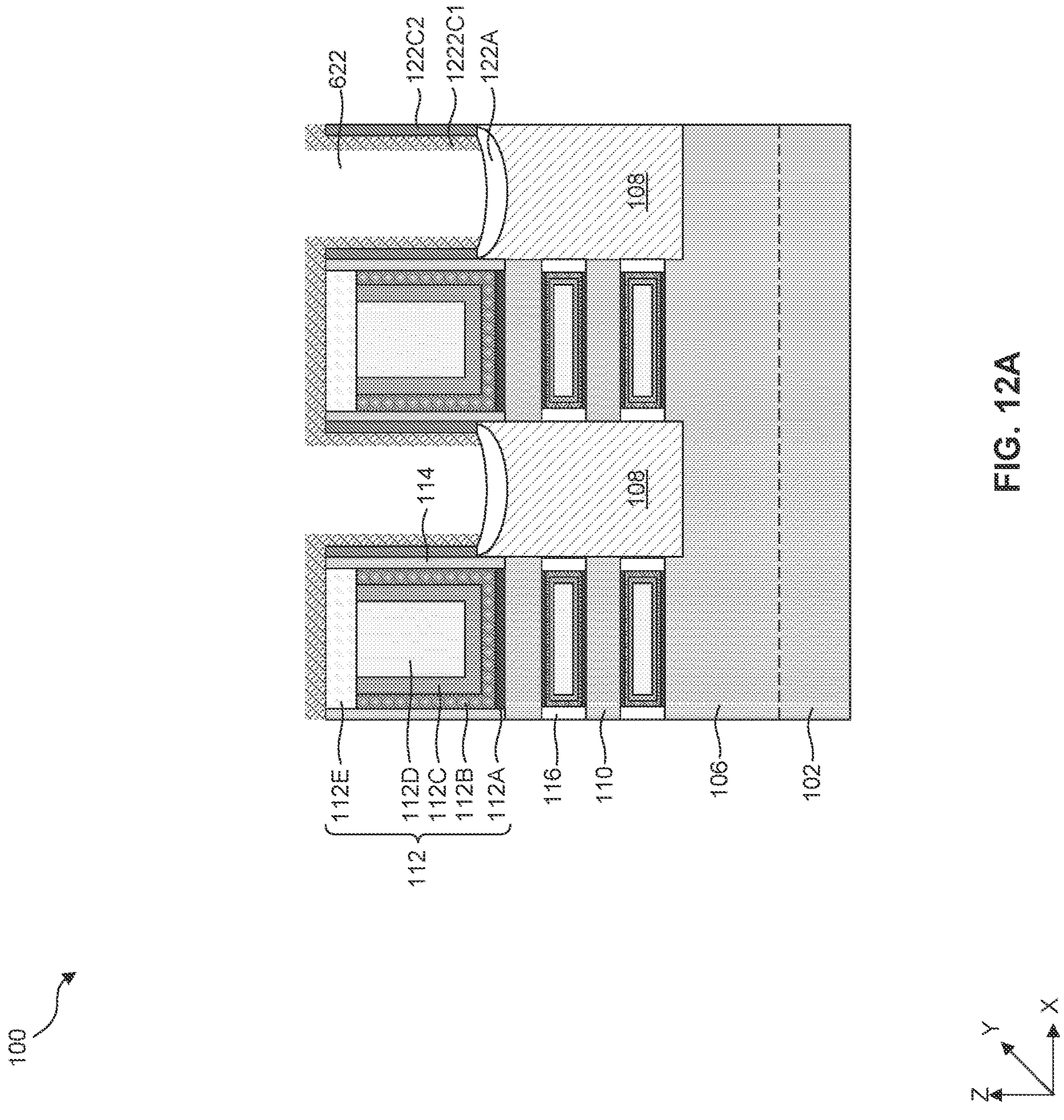
Figure 12B:
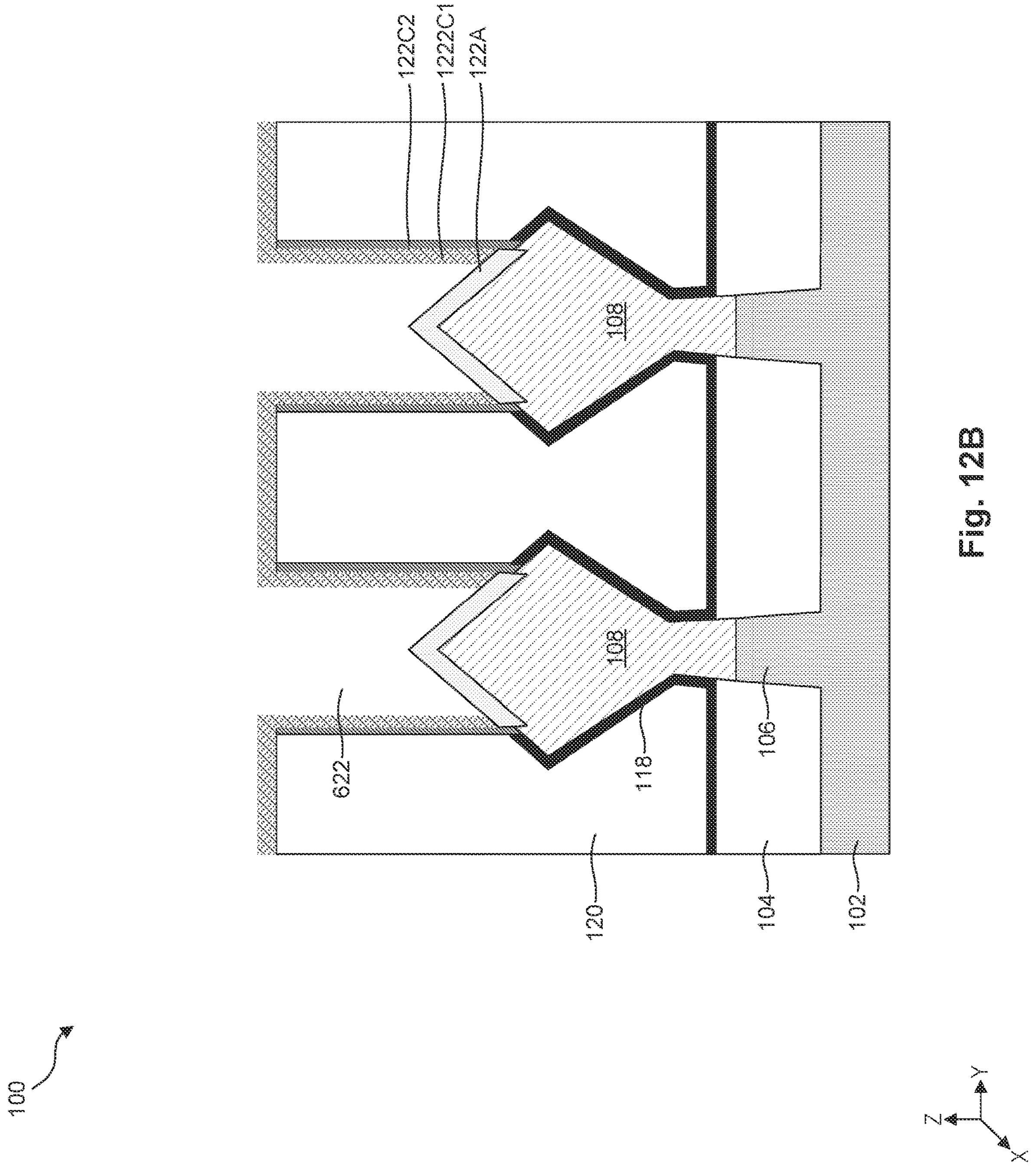
Figure 13A:
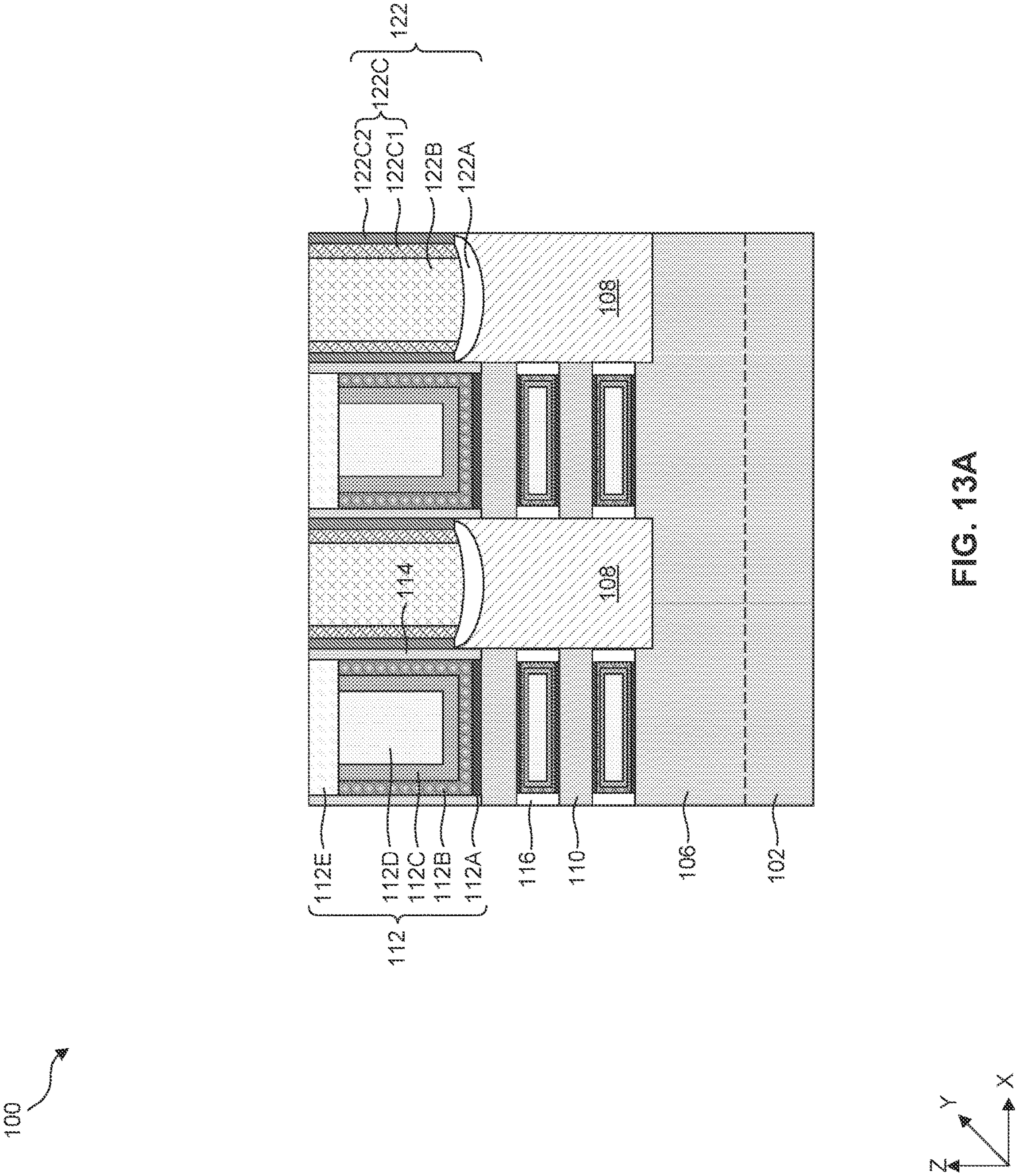
Figure 13B:
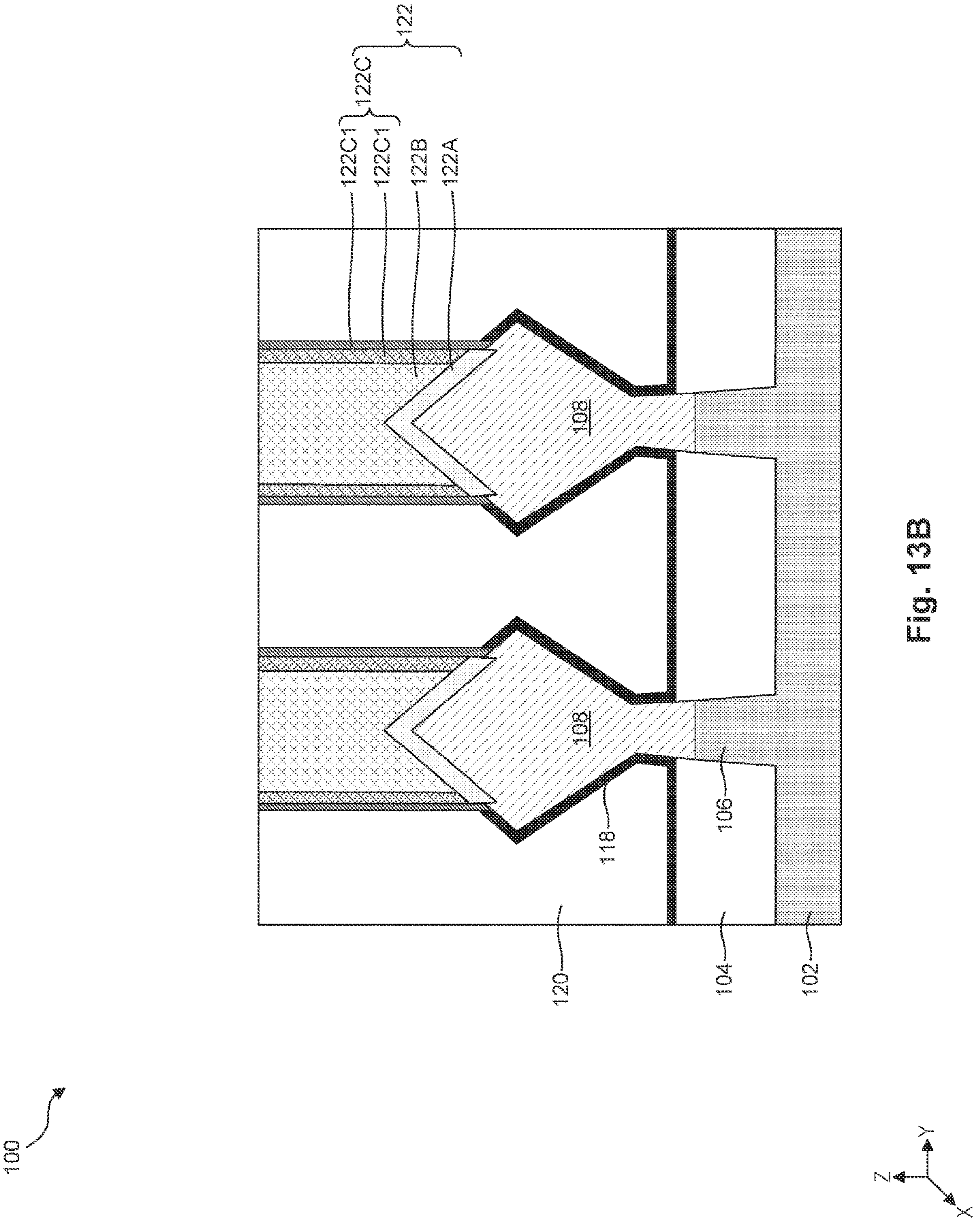

Referring to FIG. 2, in operation 225, contact structures are formed on the S/D regions. For example, as described with reference to FIGS. 6A-13B, contact structures 122 are formed on S/D regions 108. The formation of contact structures 122 can include sequential operations of (i) removing portions of first ESLs 118 and first ILD layers 120 on S/D regions 108 to form contact openings 622 on S/D regions 108, as shown in FIGS. 6A and 6B, (ii) depositing a semiconductor nitride layer 622C2 in contact opening 622, as shown in FIGS. 6A and 6B, (iii) performing a dry etch process on semiconductor nitride layer 622C2 to form semiconductor nitride layers 722C2, as shown in FIGS. 7A and 7B, (iv) performing a first densification process on semiconductor nitride layers 722C2 to form semiconductor nitride layers 122C2, as shown in FIGS. 8A and 8B, (v) performing an ion implantation of Ge atoms 940 into S/D regions 108, as shown in FIGS. 9A and 9B, (vi) depositing a metal layer 1022C1 in contact openings 622, as shown in FIGS. 10A and 10B, (vii) performing a silicidation process on metal layer 1022C1 to convert bottom portions of metal layer 1022C1 into silicide layers 122A without converting metal portions 1122C1 of metal layer 1022C1 into silicides, as shown in FIGS. 11A and 111B, (viii) performing a nitridation process on metal portions 1122C1 to form metal nitride layers 1222C1, as shown in FIGS. 12A and 12B, (ix) performing a second densification process on metal nitride layers 1222C1, (x) depositing a layer of metallic material (not shown) to fill contact openings 622, and (xi) performing a chemical mechanical polishing (CMP) process on the layer of metallic material and metal nitride layers 1222C1 to form the structures shown in FIGS. 13A and 13B.

In some embodiments, performing the first densification process on semiconductor nitride layers 722C2 can include performing a plasma treatment, a UV treatment, or a thermal treatment on semiconductor nitride layers 722C2. In some embodiments, the plasma treatment can include exposing the structures of FIGS. 7A and 7B to a nitrogen and hydrogen plasma at a temperature of about 400° C. to about 500° C. and at a power of about 500 W to about 900 W for a duration of about 3 seconds to about 20 seconds. In some embodiments, the UV treatment can include exposing the structures of FIGS. 7A and 7B to a UV radiation at a temperature of about 300° C. to about 400° C. and at a power of about 300 W to about 600 W for a duration of about 25 seconds to about 35 seconds. In some embodiments, the thermal treatment can include performing an anneal process on the structures of FIGS. 7A and 7B at a temperature of about 200° C. to about 500° C. for a duration of about 30 seconds to about 150 seconds. Within these process parameters of the plasma treatment, UV treatment, and thermal treatment, semiconductor nitride layer 122C2 can be densified to be highly resistant to etching and to diffusion of halogen atoms from etching chemicals during the formation of via structures 124, as discussed above. In some embodiments, performing the first densification process on semiconductor nitride layers 722C2 can include performing a combination of two treatments or a combination of three treatments from the plasma treatment, UV treatment, and thermal treatment on semiconductor nitride layers 722C2.

In some embodiments, the deposition of metal layer 1022C1 can include depositing a layer of titanium (Ti), tantalum (Ta), molybdenum (Mo), zirconium (Zr), hafnium (Hf), scandium (Sc), yttrium (Y), terbium (Tb), lutetium (Lu), erbium (Er), ytterbium (Yb), europium (Eu), thorium (Th), and other suitable metals for GAA NFET 100. In some embodiments, the deposition of metal layer 1022C1 can include depositing a layer of nickel (Ni), cobalt (Co), manganese (Mn), tungsten (W), iron (Fe), rhodium (Rh), palladium (Pd), ruthenium (Ru), platinum (Pt), iridium (Ir), osmium (Os), and other suitable metals for GAA PFET 100.

In some embodiments, the nitridation process can include exposing metal portions 1122C1 to ammonia gas or nitrogen gas. In some embodiments, the total thickness of metal portions 1122C1 may not be converted to metal nitride layer 1222C1. Instead portions of metal portions 1122C1 on semiconductor nitride layers 122C2 can remain unconverted. As a result, in some embodiments, a metal layer can remain at interfaces between metal nitride layer 1222C1 and semiconductor nitride layers 122C2.

In some embodiments, performing the second densification process on metal nitride layers 1222C1 can be similar to the densification process performed on semiconductor nitride layers 722C2. Within the process parameters of the second densification process, metal nitride layers 1222C1 can be densified to be highly resistant to etching and to diffusion of halogen atoms from etching chemicals during the formation of via structures 124, as discussed above. In some embodiments, performing the second densification process on metal nitride layers 1222C1 can include performing a combination of two treatments or a combination of three treatments from the plasma treatment, UV treatment, and thermal treatment on metal nitride layers 1222C1. In some embodiments, the first densification process may not be performed if the second densification is performed. The second densification process can densify semiconductor nitride layers 722C2 and metal nitride layer 1222C1. In some embodiments, the nitridation process and the second densification process are not performed when metal portions 1122C1 are removed after the silicidation process. In some embodiments, the nitridation process is not performed when metal portions 1122C1 are removed after the silicidation process and a metal nitride layer is deposited on semiconductor nitride layers 122C2 and silicide layers 122A followed by the second densification process.

Figure 14A:
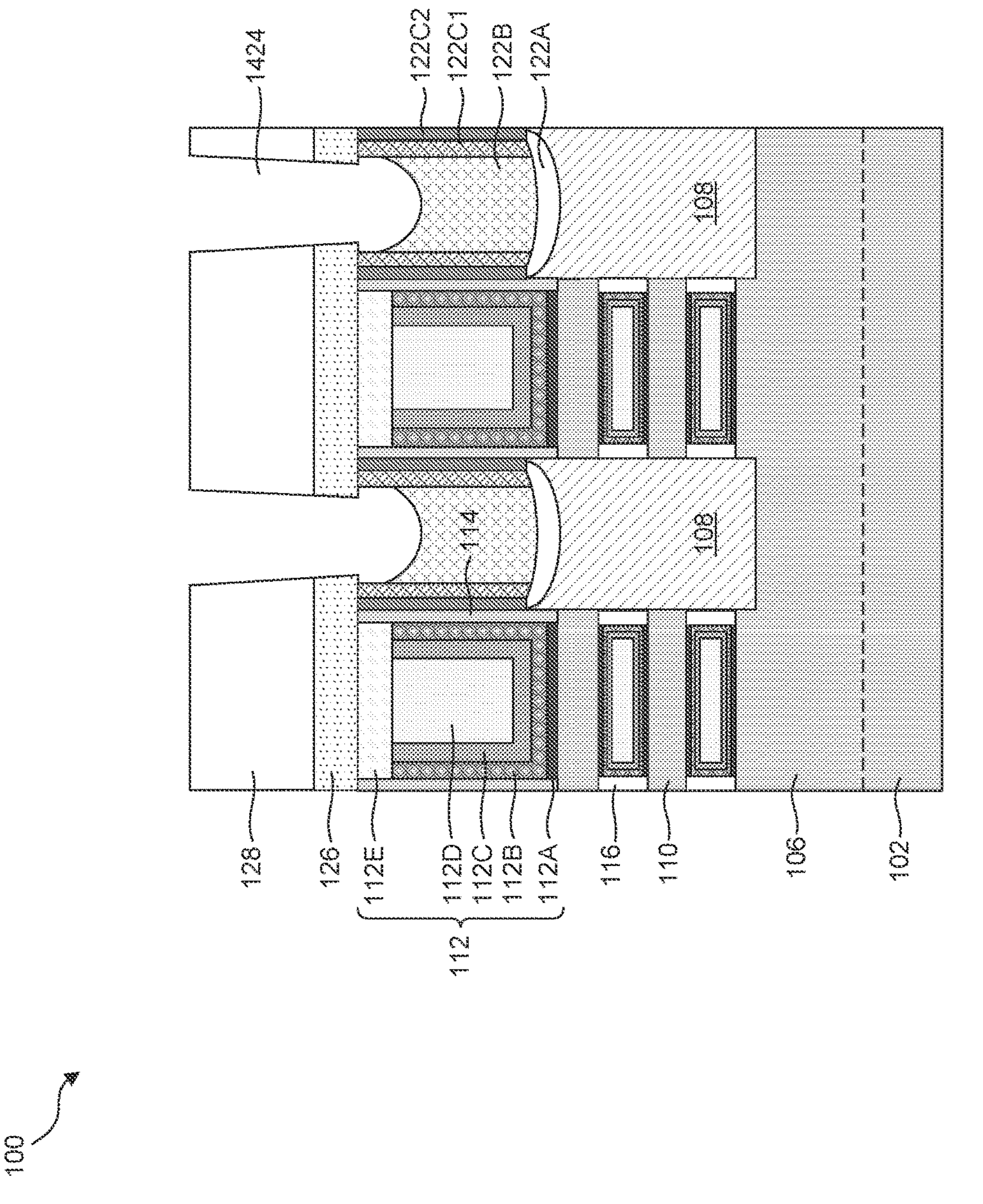
Figure 14B:
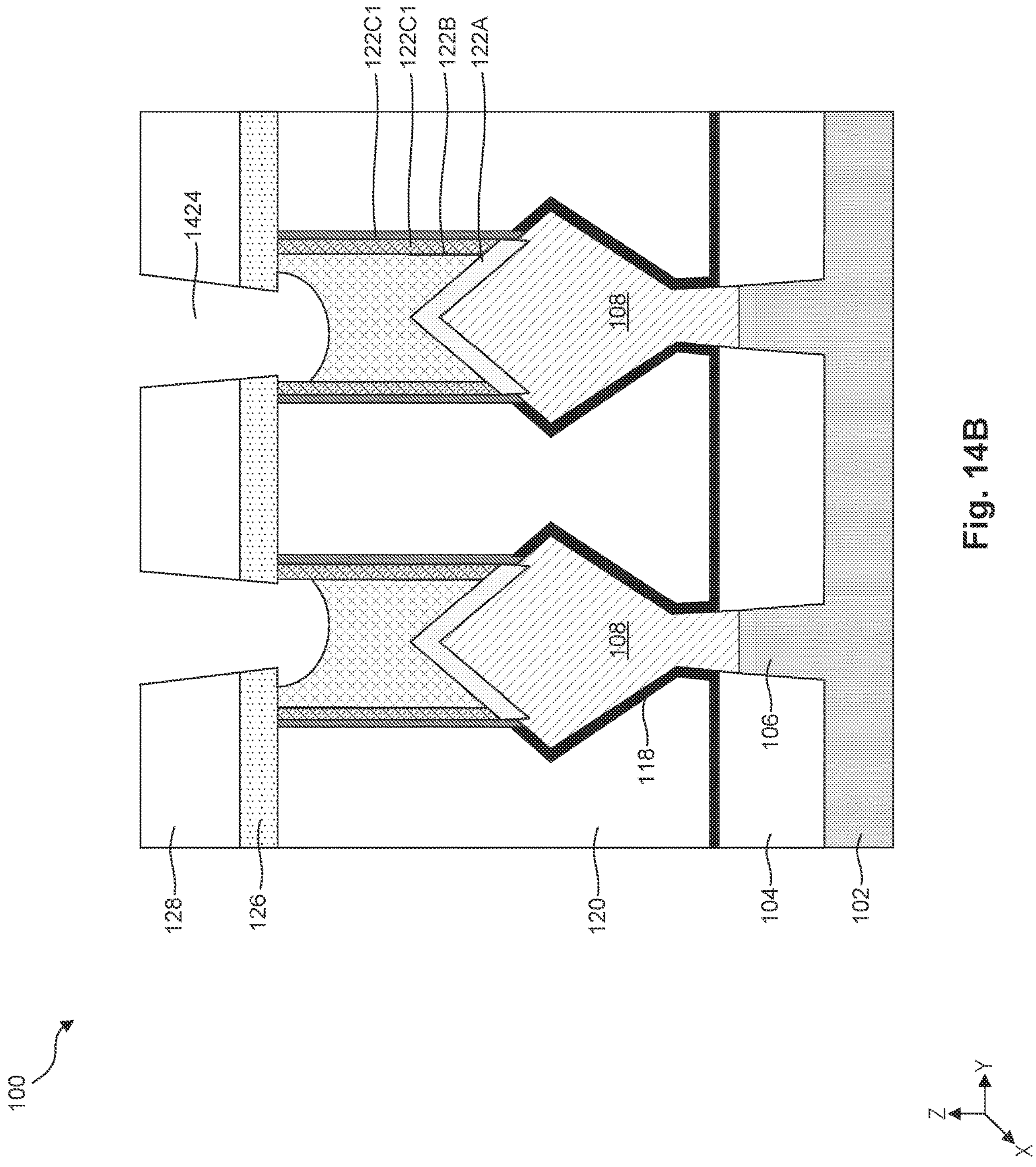

Referring to FIG. 2, in operation 230, a second ESL is formed on the contact structures and a second ILD layer is formed on the second ESL. For example, as shown in FIGS. 14A and 14B, second ESL 126 and second ILD layer 128 are formed.

Figure 15A:
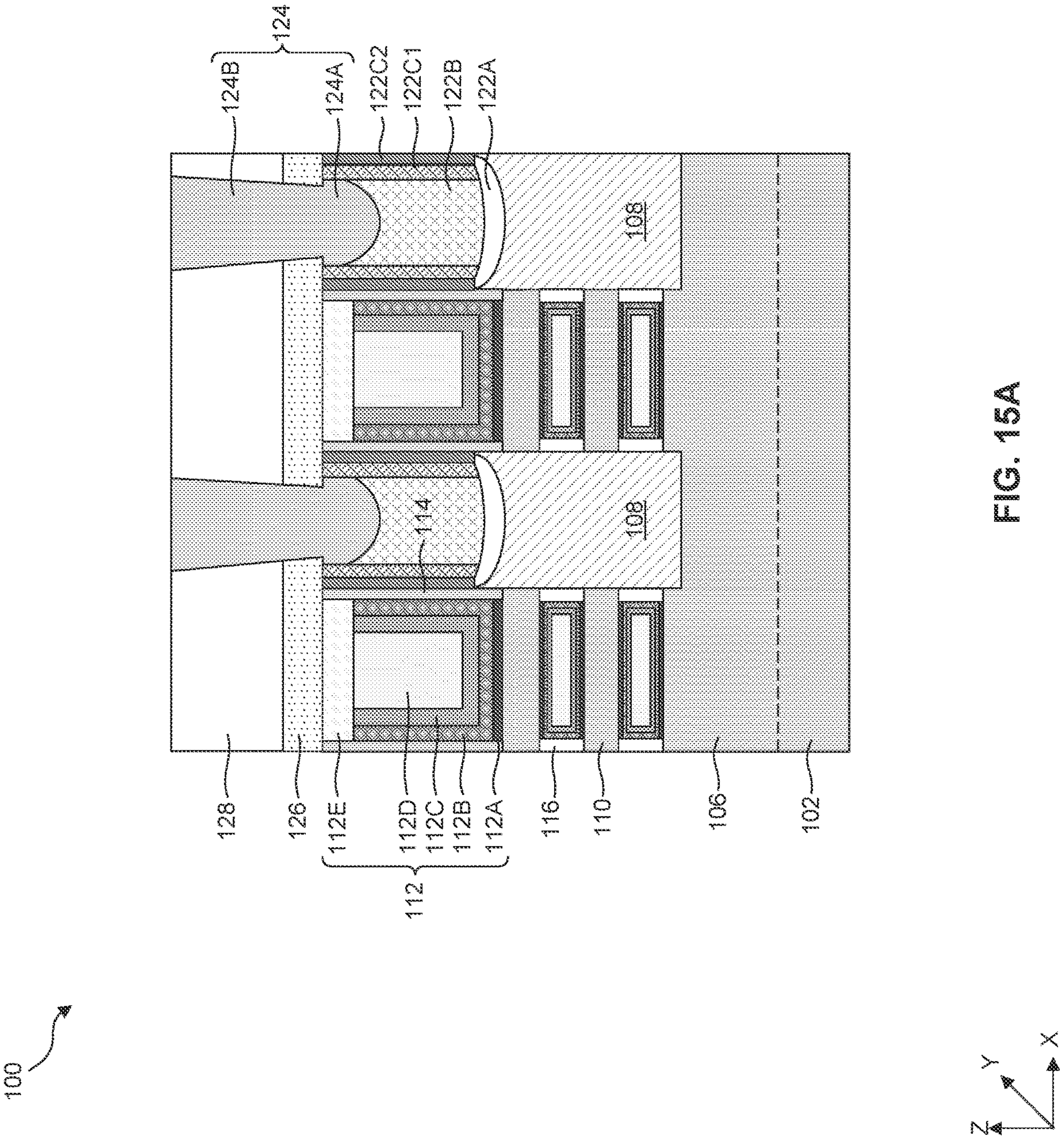
Figure 15B:
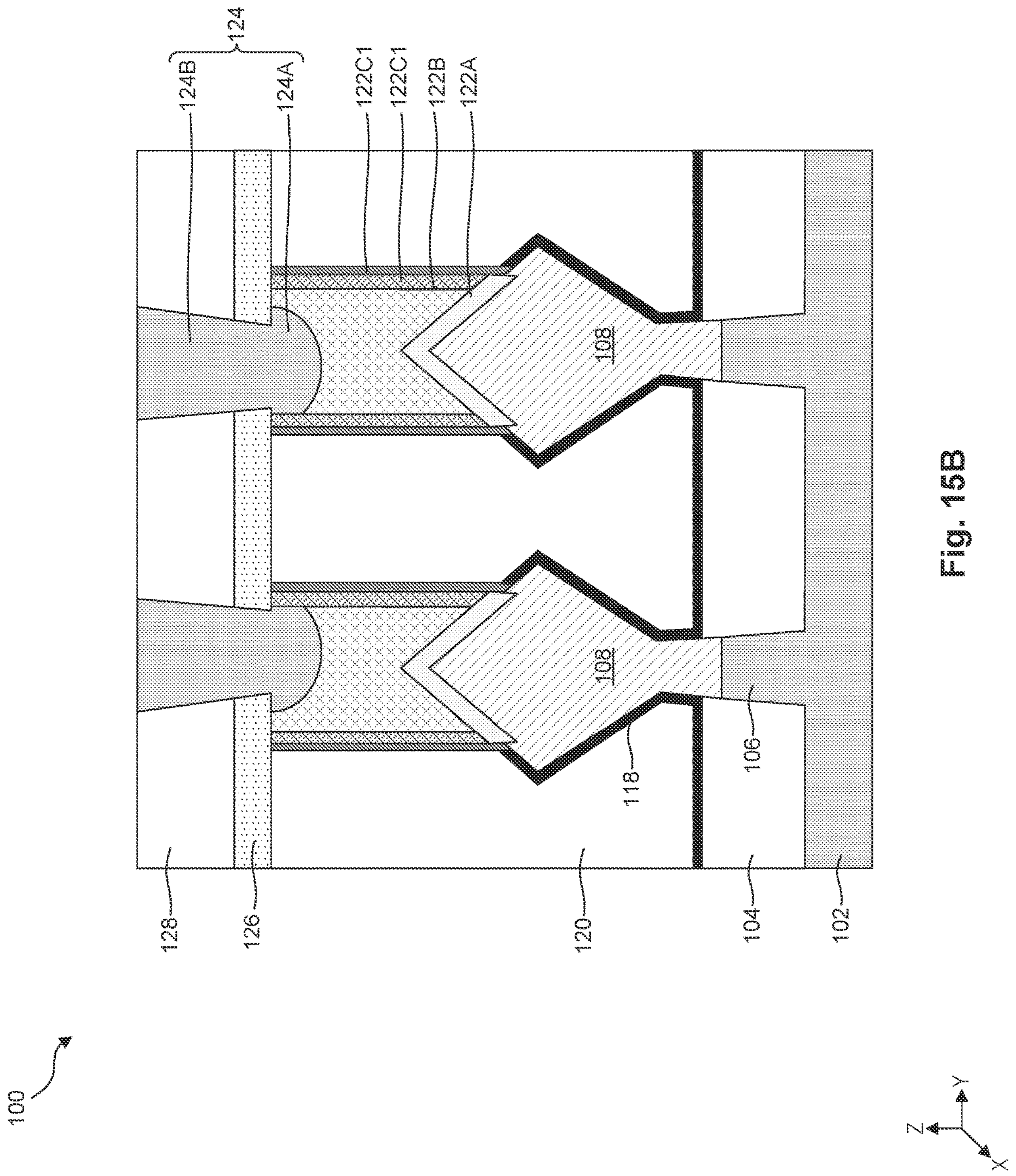

Referring to FIG. 2, in operation 235, via structures are formed on the contact structures through the second ESL and second ILD layers. For example, as described with reference to FIGS. 14A-15B, via structures 124 are formed on contact structures 122 through second ESL 126 and ILD layer 128. In some embodiments, the formation of via structures 124 can include sequential operations of (i) forming via openings 1424 by etching portions of second ILD layer 128, second ESL 126, and contact plugs 122B using hydrofluoric acid (HF), (ii) depositing a layer of metallic material (not shown) of via structures 124 to fill via openings 1424, and (iii) performing a CMP process on the metallic material to substantially coplanarize top surfaces of via structures 124 with the top surface of ILD layer 128, as shown in FIGS. 15A and 15B. In some embodiments, due to the densification of metal nitride layer 122C1 and semiconductor nitride layer 122C2 in operation 225, there may be no diffusion or minimal diffusion of halogen atoms from the etching chemicals used in the formation of via openings 1424. As a result, the exposed portions of metal nitride layer 122C1 and semiconductor nitride layer 122C2 in via openings 1424 can have higher halogen atom concentration of about 1 atomic % to about 5 atomic % compared to the portions of metal nitride layer 122C1 and semiconductor nitride layer 122C2 covered by contact plugs 122B.

The present disclosure provides example contact structures (e.g., contact structures 122) with barrier layers (e.g., barrier layers 122C) to prevent or minimize conductive material leakage between adjacent via structures (e.g., via structures 124) in FETs (e.g., finFETs and GAA FETs). In addition, the present disclosure provides example methods (e.g., method 200) of forming the barrier layers to have higher material density, higher etch resistance, and/or higher resistance to halogen and/or oxygen diffusion. The barrier layers can prevent or minimize current leakage between the adjacent via structures. In some embodiments, a FET can include contact structures (e.g., contact structures 122) disposed on S/D regions (e.g., S/D regions 108) and via structures (e.g., via structures 124) disposed on the contact structures. Via-bases (e.g., via-bases 124A) of the via structures can be disposed in the contact structures and via-tops (e.g., via-tops 124B) of the via structures can extend above the top surfaces of the contact structures. In some embodiments, the via-bases can be wider than the via-tops, which can result in adjacent via-bases being closer to each other than adjacent via-tops. In some embodiments, to prevent conductive material leakage between adjacent via-bases that are spaced apart from each other by a distance less than about 30 nm, the FET contact structures can include barrier layers (e.g., barrier layers 122C) disposed between the adjacent via-bases. Each of the barrier layers can surround the conductive plugs (e.g., contact plugs 122B) of the contact structure and the via structure.

In some embodiments, the barrier layer can include a stack of nitride layers. In some embodiments, the stack of nitride layers can include a semiconductor nitride layer (e.g., semiconductor nitride layer 122C2), a metal layer, and a metal nitride layer (e.g., metal nitride layer 122C1). In some embodiments, a post-deposition plasma treatment, a post-deposition ultra-violet (UV) radiation treatment, and/or a post-deposition thermal treatment can be performed on the semiconductor nitride layer, metal layer, and/or metal nitride layer to improve the structural integrity of the barrier layers. The post-deposition treatment(s) can increase the material density, etch resistance, and/or resistance to halogen and/or oxygen diffusion of the semiconductor nitride layer, metal layer, and/or metal nitride layer. The presence of high concentration (e.g., greater than about 5 atomic %) of halogen and/or oxygen impurities in the barrier layers can lead to cracks in the barrier layers during subsequent processing of the FET. As a result, the post-deposition treatment(s) can prevent or minimize damages to the barrier layers, thus preventing or minimizing the conductive material leakage between adjacent via structures.

In some embodiments, a method includes forming a fin base on a substrate, epitaxially growing a S/D region on the fin base, forming a contact opening on the S/D region, forming a semiconductor nitride layer on a sidewall of the contact opening, performing a densification process on the semiconductor nitride layer to form a densified semiconductor nitride layer, forming a silicide layer on an exposed surface of the S/D region in the contact opening, forming a contact plug in the contact opening, and forming a via structure in the contact plug.

In some embodiments, a method includes forming a fin base on a substrate, epitaxially growing a S/D region on the fin base, forming a contact opening on the S/D region, forming a semiconductor nitride layer on a sidewall of the contact opening, depositing a metal layer on the semiconductor nitride layer, performing a nitridation process on the metal layer to form a metal nitride layer on the semiconductor nitride layer, performing a densification process on the metal nitride layer to form a densified metal nitride layer and a densified semiconductor nitride layer, and forming a contact plug in the contact opening.

In some embodiments, a semiconductor device includes a substrate, a fin base disposed on the substrate, a S/D region disposed on the fin base, a contact structure, and a via structure. The contact structure includes a silicide layer, a contact plug disposed on the silicide layer, a metal nitride layer surrounding the contact plug, and a semiconductor nitride layer disposed on the metal nitride layer. The via structure is disposed in the contact plug and in contact with a portion of the metal nitride layer.

The foregoing disclosure outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
- forming a fin base on a substrate;
- epitaxially growing a source/drain (S/D) region on the fin base;
- forming a contact opening on the S/D region;
- depositing a semiconductor nitride layer with a first nitride portion on a sidewall of the contact opening and a second nitride portion on a top surface of the S/D region;
- removing the second nitride portion to expose the top surface of the S/D region;
- performing, after removing the second nitride portion, a densification process on the first nitride portion to form a densified semiconductor nitride layer on the sidewall of the contact opening;
- forming a silicide layer on the exposed top surface of the S/D region in the contact opening;
- forming a contact plug in the contact opening; and
- forming a via structure in the contact plug.

2. The method of claim 1, wherein performing the densification process comprises performing a plasma treatment, an ultra-violet (UV) treatment, or a thermal treatment on the first nitride portion.

3. The method of claim 1, wherein performing the densification process comprises exposing the first nitride portion to a nitrogen and hydrogen plasma.

4. The method of claim 1, wherein performing the densification process comprises exposing the first nitride portion to an ultra-violet (UV) radiation.

5. The method of claim 1, wherein performing the densification process comprises performing an anneal process on the first nitride portion.

6. The method of claim 1, further comprising:
- depositing a metal nitride layer on the densified semiconductor nitride layer; and
- performing an other densification process on the metal nitride layer.

7. The method of claim 1, wherein forming the silicide layer comprises:
- depositing a metal layer with a first metal portion on the exposed top surface of the S/D region and a second metal portion on the densified semiconductor nitride layer; and
- converting the first metal portion to the silicide layer.

8. The method of claim 7, further comprising performing a nitridation process on the second metal portion.

9. The method of claim 7, further comprising performing an other densification process on the second metal portion.

10. The method of claim 1, wherein performing the densification process comprises performing a plasma treatment and an ultra-violet (UV) treatment, or a plasma treatment and a thermal treatment on the first nitride portion.

11. A method, comprising:

forming a fin base on a substrate;

epitaxially growing a source/drain (S/D) region on the fin base;

forming a contact opening on the S/D region;

forming a semiconductor nitride layer on a sidewall of the contact opening;

depositing a metal layer on the semiconductor nitride layer;

performing a nitridation process on the metal layer to form a metal nitride layer on the semiconductor nitride layer;

performing a densification process on the metal nitride layer to form a densified metal nitride layer and a densified semiconductor nitride layer; and forming a contact plug in the contact opening.

12. The method of claim 11, wherein performing the densification process comprises performing a plasma treatment, an ultra-violet (UV) treatment, or a thermal treatment on the metal nitride layer.

13. The method of claim 11, wherein performing the densification process comprises exposing the metal nitride layer to a nitrogen and hydrogen plasma.

14. The method of claim 11, wherein performing the densification process comprises exposing the metal nitride layer to an ultra-violet (UV) radiation.

15. The method of claim 11, wherein performing the densification process comprises performing an anneal process on the metal nitride layer.

16. The method of claim 11, further comprising implanting germanium atoms in the S/D region prior to depositing the metal layer.

17. A method, comprising:

epitaxially growing a source/drain (S/D) region on a substrate;

forming a contact structure, comprising:

depositing a semiconductor nitride layer with a first nitride portion on a sidewall of a contact opening on the S/D region and a second nitride portion on a top surface of the S/D region;

removing the second nitride portion to expose the top surface of the S/D region;

forming a silicide layer on the exposed top surface of the S/D region;

forming a metal nitride layer on a sidewall of the first nitride portion;

performing a densification process on the metal nitride layer to form a densified metal nitride layer and a densified first nitride portion of the semiconductor nitride layer; and depositing a contact plug on the silicide layer and the densified metal nitride layer; and forming a via structure in the contact plug and in contact with a portion of the densified metal nitride layer.

18. The method of claim 17, wherein forming the metal nitride layer comprises:

depositing a metal layer on the semiconductor nitride layer;

performing a nitridation process on the metal layer to form the metal nitride layer on the sidewall of the first nitride portion.

19. The method of claim 17, further comprising implanting germanium atoms in the S/D region after removing the second nitride portion and prior to forming the silicide layer.

20. The method of claim 17, wherein performing the densification process comprises exposing the metal nitride layer to a nitrogen and hydrogen plasma.

* * * * *